(12) United States Patent  
Kijima et al.

(10) Patent No.: US 7,569,400 B2  
(45) Date of Patent: Aug. 4, 2009

(54) FERROELECTRIC FILM, METHOD OF MANUFACTURING FERROELECTRIC FILM, FERROELECTRIC CAPACITOR, AND FERROELECTRIC MEMORY

(75) Inventors: Takeshi Kijima, Matsumoto (JP); Yasuaki Hamada, Suwa (JP); Tomokazu Kobayashi, Suwa (JP); Hiromu Miyazawa, Azumino (JP)

(73) Assignee: Seiko Epson Corporation (JP)

( * ) Notice: Subject to any disclaimer, the term of this patent is extended or adjusted under 35 U.S.C. 154(b) by 638 days.

(21) Appl. No.: 11/316,168

(22) Filed: Dec. 22, 2005

(65) Prior Publication Data

US 2006/0138507 A1 Jun. 29, 2006

(30) Foreign Application Priority Data

Dec. 27, 2004 (JP) .............................. 2004-376701

(51) Int. Cl. *H01L 21/00* (2006.01)
(52) U.S. Cl. .................................. 438/3; 257/E21.664
(58) Field of Classification Search .......... 257/E21.664, 257/295; 438/3
See application file for complete search history.

(56) References Cited

U.S. PATENT DOCUMENTS

| | | | |
|---|---|---|---|
| 3,666,665 A * | 5/1972 | Chapman et al. | 252/62.9 R |
| 5,654,456 A * | 8/1997 | Scott et al. | 556/28 |
| 5,908,802 A * | 6/1999 | Voigt et al. | 501/134 |
| 6,056,994 A * | 5/2000 | Paz de Araujo et al. | 427/554 |
| 6,093,338 A * | 7/2000 | Tani et al. | 252/62.9 R |
| 2001/0041374 A1 * | 11/2001 | Hintermaier et al. | 438/3 |
| 2002/0130349 A1 * | 9/2002 | McClure et al. | 257/310 |
| 2002/0142491 A1 | 10/2002 | Shimoda et al. | |
| 2003/0031622 A1 * | 2/2003 | Eitel et al. | 423/598 |
| 2004/0214352 A1 | 10/2004 | Kijima et al. | |
| 2005/0003237 A1 * | 1/2005 | Lee | 428/697 |
| 2005/0162047 A1 * | 7/2005 | Torii et al. | 310/358 |
| 2005/0272171 A1 * | 12/2005 | Nakayama et al. | 438/3 |

FOREIGN PATENT DOCUMENTS

| | | |
|---|---|---|
| DE | 3718486 | 12/1988 |
| EP | 0890980 | 1/1999 |
| EP | 1160870 | 12/2001 |
| JP | 09052763 | 2/1997 |
| JP | 09-116107 | 5/1997 |
| WO | WO90/12755 | 11/1990 |

OTHER PUBLICATIONS

Zhu Xinhua et al: "Transmission electron microscopy observations of ferroelectric domains in the tetragonal Pb(Ni1/3Nb2/3)03 &ndash"; Journal of Applied Physics, American Institute of Physics, New York, US, vol. 89, No. 9, May 1, 2001, pp. 5079-5082, XP012053402; ISSN: 0021-8979.

(Continued)

*Primary Examiner*—Marcos D. Pizarro
*Assistant Examiner*—Igwe U. Anya
(74) *Attorney, Agent, or Firm*—Harness, Dickey & Pierce, P.L.C.

(57) ABSTRACT

A ferroelectric film having a ferroelectric shown by a general formula $(Pb_{1-d}Bi_d)(B_{1-a}X_a)O_3$, B including at least one of Zr and Ti, X including at least one of Nb and Ta, "a" being in a range of "$0.05 \leq a \leq 0.4$", and "d" being in a range of "$0 < d < 1$".

7 Claims, 20 Drawing Sheets

OTHER PUBLICATIONS

Miyayama M et al: "Electrical anistropy in single crystals of Bi-layer structured ferroelectrics"; Ceramics International, Elsevier, Amsterdam, NL, vol. 26, No. 5, Jun. 16, 2000, pp. 529-533, XP004209802; ISSN: 0272-8842.

Tuttle B A et al: "Chemically Prepared Lead Magnesium Niobate Dielectrics" Materials Research Society Symposium Proceedings, Materials Research Society, Pittsburg, PA, US, vol. 495, 1998, pp. 185-195, XP008074133; ISSN: 0272-9172.

Boyle T J et al: "Aging Characteristics of a Hybrid Sol-Gel PB(ZR,TI)O3 Precursor Solution"; Journal of Materials Research, Materials Research Society, Warrendale, PA, US, vol. 12, No. 4, Apr. 1997, pp. 1022-1030, XP008066340; ISSN: 0884-2914.

Ayyub P et al: "Ferroelectric behavior in thin films of antiferroelectric materials"; Physical Review B (Condensed Matter) APS Through AIP USA, vol. 57, No. 10, Mar. 1, 1998, pp. R5559-R5562, XP002426919; ISSN: 0163-1829.

* cited by examiner

US 7,569,400 B2

FERROELECTRIC FILM, METHOD OF MANUFACTURING FERROELECTRIC FILM, FERROELECTRIC CAPACITOR, AND FERROELECTRIC MEMORY

Japanese Patent Application No. 2004-376701, filed on Dec. 27, 2004, is hereby incorporated by reference in its entirety.

BACKGROUND OF THE INVENTION

The present invention relates to a ferroelectric film, a method of manufacturing a ferroelectric film, a ferroelectric capacitor, and a ferroelectric memory.

In recent years, a ferroelectric film such as $Pb(Zr,Ti)O_3$ (PZT) or $SrBi_2Ta_2O_9$ (SBT), a ferroelectric capacitor using the ferroelectric film, and a ferroelectric memory device have been extensively researched and developed. The structure of the ferroelectric memory device is roughly divided into a 1T type, 1T1C type, 2T2C type, and simple matrix type. A 1T type ferroelectric memory device has such a structure that the retention time (data retention time) is as short as one month due to occurrence of an internal electric field in the capacitor. Therefore, it is considered that the 1T type ferroelectric memory device cannot ensure a 10-year guarantee generally required for semiconductor devices. A 1T1C type or 2T2C type ferroelectric memory device has a configuration approximately the same as that of a DRAM, and includes a select transistor. Therefore, the DRAM manufacturing technology can be utilized, and a write speed approximately equal to that of an SRAM can be realized. Therefore, small capacity products having a capacity of 256 kbits or less have been produced on a commercial basis.

PZT has been mainly used as the ferroelectric material for the 1T1C type or 2T2C type ferroelectric memory device. As the ferroelectric material, PZT which has a composition in or near the mixed region of the rhombohedral crystal and the tetragonal crystal, in which the Zr/Ti ratio is 52/48 or 40/60, and is doped with an element such as La, Sr, or Ca, has been used. The above region is used in order to ensure reliability which is most required for a memory device.

Specifically, an excellent hysteresis shape is obtained in the Ti-rich tetragonal region. However, a Schottky defect occurs in the tetragonal region due to the ionic crystal structure. This causes leakage current characteristics or imprint characteristics (degree of change in hysteresis shape) to deteriorate, so that it is difficult to ensure reliability. Therefore, PZT having a composition in or near the mixed region of the rhombohedral crystal and the tetragonal crystal is used as described above.

A simple matrix type ferroelectric memory device has a cell size smaller than that of the 1T1C type or 2T2C type ferroelectric memory device, and enables multilayering of capacitors. Therefore, the simple matrix type ferroelectric memory device is expected to enable an increase in the degree of integration and a reduction in cost. A related-art simple matrix type ferroelectric memory device is disclosed in JP-A-9-116107, for example. JP-A-9-116107 discloses a drive method in which, when writing data into a memory cell, a voltage one-third of a write voltage is applied to unselected memory cells.

A hysteresis loop having excellent squareness is indispensable in order to obtain a simple matrix type ferroelectric memory device. As a ferroelectric material which can deal with such a requirement, Ti-rich tetragonal PZT can be given. However, it is difficult to ensure reliability by using Ti-rich tetragonal PZT in the same manner as the 1T1C type or 2T2C type ferroelectric memory.

SUMMARY

According to a first aspect of the invention, there is provided a ferroelectric film, comprising a ferroelectric shown by a general formula $(Pb_{1-d}Bi_d)(B_{1-a}X_a)O_3$, B including at least one of Zr and Ti;
X including at least one of Nb and Ta;
"a" being in a range of "$0.05 \leq a \leq 0.4$"; and
"d" being in a range of "$0 < d < 1$".

According to a second aspect of the invention, there is provided a method of manufacturing a ferroelectric film including a ferroelectric shown by a general formula $(Pb_{1-d}Bi_d)(B_{1-a}X_a)O_3$, B including at least one of Zr and Ti;
X including at least one of Nb and Ta;
"a" being in a range of "$0.05 \leq a \leq 0.4$";
"d" being in a range of "$0 < d < 1$"; and
the method comprising:

mixing a sol-gel raw material including a hydrolysis-condensation product of a metal alkoxide containing at least Zr and Ti, a polycarboxylic acid or a polycarboxylic acid ester, and an organic solvent; and forming a ferroelectric precursor solution including an ester bond by esterification of the polycarboxylic acid or a polycarboxylic acid derived from the polycarboxylic acid ester and the metal alkoxide.

According to a third aspect of the invention, there is provided a ferroelectric capacitor, comprising the above-described ferroelectric film.

According to a fourth aspect of the invention, there is provided a ferroelectric memory, comprising the above-described ferroelectric capacitor.

DETAILED DESCRIPTION OF THE EMBODIMENT

Figure 1:
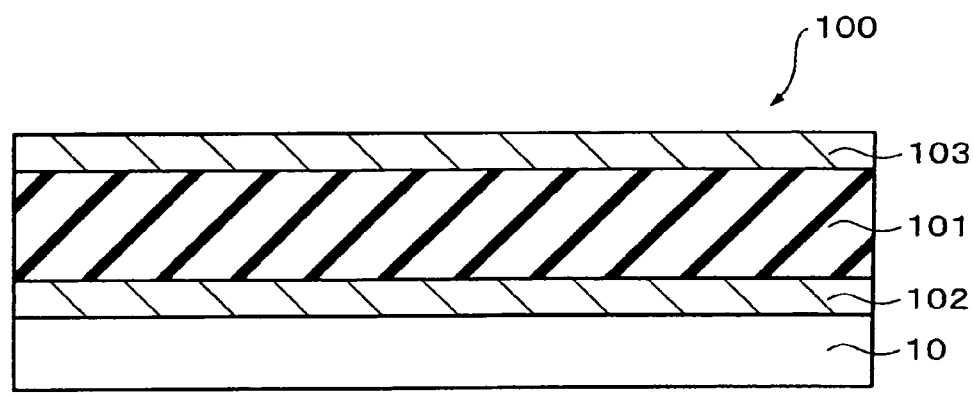
FIG. 1 is a cross-sectional diagram showing a ferroelectric capacitor according to one embodiment of the invention.

The invention may provide a ferroelectric capacitor and a ferroelectric memory both exhibiting excellent hysteresis characteristics. The invention may also provide a ferroelectric film suitable for the ferroelectric memory and the ferroelectric capacitor, and a method of manufacturing the same.

According to one embodiment of the invention, there is provided a ferroelectric film, comprising a ferroelectric shown by a general formula $(Pb_{1-d}Bi_d)(B_{1-a}X_a)O_3$, B including at least one of Zr and Ti;
X including at least one of Nb and Ta;
"a" being in a range of "$0.05 \leq a \leq 0.4$"; and
"d" being in a range of "$0<d<1$".

A ferroelectric film according to one embodiment of the invention includes a ferroelectric shown by a general formula $(Pb_{1-d}Bi_d)_{1-b}(B_{1-a}X_a)O_3$, B including at least one of Zr and Ti, X including at least one of Nb and Ta, a, b, and d satisfying a relational expression "$b=(a+d)/(2+d)$", a being in a range of "$0.05 \leq a \leq 0.4$", and d being in a range of "$0<d<1$".

A ferroelectric film according to one embodiment of the invention includes a ferroelectric shown by a general formula $(Pb_{1-d}Bi_d)_{1-b}(B_{1-a}X_a)O_{3-c}$, B including at least one of Zr and Ti, X including at least one of Nb and Ta, a, b, c, and d satisfying a relational expression "$b=(a+d+2c)/(2+d)$", a being "$0.05 \leq a \leq 0.4$", c being in a range of "$0 \leq c \leq 0.05$", and d being in a range of "$0<d<1$".

According to one embodiment of the invention, the neutrality of the entire crystal structure can be maintained by replacing Pb in the A site of PZT with Bi having a valence higher than that of Pb. As a result, occurrence of oxygen deficiency can be prevented. This prevents occurrence of leakage current from the ferroelectric film. Moreover, the characteristics of the ferroelectric film, such as imprint characteristics, retention characteristics, and fatigue characteristics, can be improved.

Since Bi has strong covalent bonding properties with oxygen in comparison with Pb, Bi does not easily leave the crystal. The degree of covalent bonding properties is determined depending on the relative values of the orbital levels of atoms which bond with each other. In the perovskite type structure, as the 6 p orbital level of the atom which enters the A site becomes closer to the 2 p orbital level of oxygen, the orbital of the A-site atom and the orbital of the oxygen atom closest to the A site tend to be hybridized, so that Bi does not easily leave the crystal in comparison with Pb. This also prevents occurrence of leakage current from the ferroelectric film.

In this ferroelectric film, X may be positioned in a B site of a perovskite type structure.

In this ferroelectric film, Pb and Bi may be positioned in an A site of a perovskite type structure.

In this ferroelectric film, "d" may be in a range of "$0<d \leq 0.2$".

This ferroelectric film may have a tetragonal structure and being pseudocubic (111) oriented.

In this ferroelectric film, X may be Nb.

This ferroelectric film may comprise:
a eutectic of the ferroelectric shown by the general formula $(Pb_{1-d}Bi_d)(B_{1-a}X_a)O_3$ and a ferroelectric shown by $BiNbO_4$.

In this ferroelectric film, a molar ratio of Bi to Pb included in the eutectic may be 3/7 or more.

In this ferroelectric film,
a crystal of $(Pb_{1-d}Bi_d)(B_{1-a}X_a)O_3$ may have a perovskite type structure; and
a crystal of $BiNbO_4$ may have a bismuth-layered perovskite type structure.

According to one embodiment of the invention, there is provided a method of manufacturing a ferroelectric film including a ferroelectric shown by a general formula $(Pb_{1-d}Bi_d)(B_{1-a}X_a)O_3$, B including at least one of Zr and Ti;
X including at least one of Nb and Ta;
"a" being in a range of "$0.05 \leq a \leq 0.4$";
"d" being in a range of "$0<d<1$"; and the method comprising:
mixing a sol-gel raw material including a hydrolysis-condensation product of a metal alkoxide containing at least Zr and Ti, a polycarboxylic acid or a polycarboxylic acid ester, and an organic solvent; and forming a ferroelectric precursor solution including an ester bond by esterification of the polycarboxylic acid or a polycarboxylic acid derived from the polycarboxylic acid ester and the metal alkoxide.

In this method of manufacturing a ferroelectric film,
the ferroelectric film may further include a crystal of $BiNbO_4$, and the method may comprise:
mixing a sol-gel raw material including a hydrolysis-condensation product of a metal alkoxide containing at least Zr and Ti, a polycarboxylic acid or a polycarboxylic acid ester, and an organic solvent; and forming a ferroelectric precursor solution including an ester bond by esterification of the polycarboxylic acid or a polycarboxylic acid derived from the polycarboxylic acid ester and the metal alkoxide.

This method of manufacturing a ferroelectric film may comprise:
mixing a sol-gel raw material including a bismuth carboxylate when mixing the sol-gel raw material, the polycarboxylic acid or the polycarboxylic acid ester, and the organic solvent.

This method of manufacturing a ferroelectric film may comprise:

mixing a sol-gel raw material including a lead carboxylate when mixing the sol-gel raw material, the polycarboxylic acid or the polycarboxylic acid ester, and the organic solvent.

In this method of manufacturing a ferroelectric film, the polycarboxylic acid or the polycarboxylic acid ester may be a dicarboxylic acid or a dicarboxylic acid ester.

As examples of the polycarboxylic acid used in this embodiment, the following compounds can be given. As examples of a tricarboxylic acid, trans-aconitic acid, trimesic acid, and the like can be given. As examples of a tetracarboxylic acid, pyromellitic acid, 1,2,3,4-cyclopentanetetracarboxylic acid, and the like can be given. As examples of the polycarboxylic acid ester which dissociates in an alcohol and functions as a polycarboxylic acid, dicarboxylic acid esters such as dimethyl succinate, diethyl succinate, dibutyl oxalate, dimethyl malonate, dimethyl adipate, dimethyl maleate, and diethyl fumarate, tricarboxylic acid esters such as tributyl citrate, triethyl 1,1,2-ethanetricarboxylate, and trimethyl 1,2,4-benzenetricarboxylate, tetracarboxylic acid esters such as tetraethyl 1,1,2,2-ethanetetracarboxylate, and the like can be given. These polycarboxylic acid esters dissociate in the presence of an alcohol and function as polycarboxylic acids. A feature of one embodiment of the invention is that the network is grown by esterification by using the polycarboxylic acid. Since the ester network is not grown when using a monocarboxylic acid or a monocarboxylic acid ester, such as acetic acid or methyl acetate, a monocarboxylic acid or a monocarboxylic acid ester is not used in one embodiment of the invention.

In this method of manufacturing a ferroelectric film, the dicarboxylic acid ester may be preferably at least one compound selected from a succinic acid ester, maleic acid ester, and malonic acid ester. As specific examples of these esters, dimethyl succinate, dimethyl maleate, and dimethyl malonate can be given.

This method of manufacturing a ferroelectric film may comprise:

mixing a sol-gel raw material including Si or Si and Ge when mixing the sol-gel raw material, the polycarboxylic acid or the polycarboxylic acid ester, and the organic solvent.

According to one embodiment of the invention, there is provided a ferroelectric capacitor, comprising the above-described ferroelectric film.

This ferroelectric capacitor may further comprise an electrode having a perovskite type structure, wherein the ferroelectric film is formed on the electrode.

According to one embodiment of the invention, there is provided a ferroelectric memory, comprising the above-described ferroelectric capacitor.

These embodiments of the invention will be described below with reference to the drawings.

1. Ferroelectric Film and Ferroelectric Capacitor

FIG. 1 is a cross-sectional diagram schematically showing a ferroelectric capacitor 100 using a ferroelectric film 101 according to one embodiment of the invention.

As shown in FIG. 1, the ferroelectric capacitor 100 includes a substrate 10, a first electrode 102, the ferroelectric film 101 formed on the first electrode 102, and a second electrode 103 formed on the ferroelectric film 101.

The thicknesses of the first electrode 102 and the second electrode 103 are about 50 to 150 nm, for example.

The ferroelectric film 101 includes a ferroelectric having a perovskite type crystal structure and shown by the following general formula (1).

(1)

In the general formula (1), B includes at least one of Zr and Ti, X includes at least one of Nb and Ta, a is in the range of "$0.05 \leqq a \leqq 0.4$", and d is in the range of "$0<d<1$".

Figure 2A:
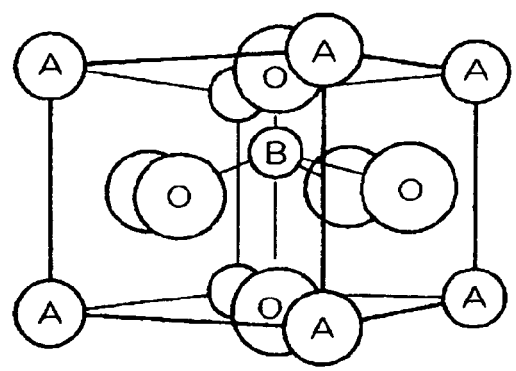
FIGS. 2A and 2B are illustrative of a perovskite type crystal structure.
Figure 2B:
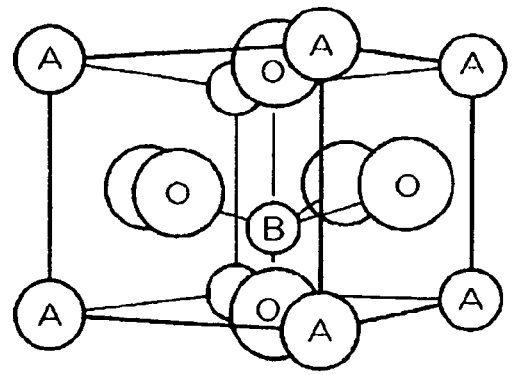

A perovskite type ferroelectric has a crystal structure as shown in FIGS. 2A and 2B. In FIGS. 2A and 2B, the position indicated by A is called an A site, and the position indicated by B is called a B site.

In the general formula (1), Pb and Bi are positioned in the A site, and B and X are positioned in the B site. In FIGS. 2A and 2B, O (oxygen) is located at the position indicated by O. X may be a metal element having a valence higher than those of Zr and Ti. As the metal element having a valence higher than those of Zr and Ti (+4), Nb (+5), Ta (+5), and the like can be given.

In a ferroelectric having a Pb-based perovskite type structure such as PZT, Pb positioned in the A site of the perovskite type structure tends to vaporize due to high vapor pressure. When Pb leaves the A site, oxygen deficiency occurs at the same time according to the charge neutrality principle. This phenomenon is called a Schottky defect. For example, when oxygen deficiency occurs in PZT, the band gap of PZT is decreased. A decrease in the band gap causes a decrease in the band offset at the metal electrode interface, so that the leakage current characteristics of the ferroelectric film formed of PZT deteriorate. Moreover, oxygen deficiency causes an oxygen ion current to occur. Accumulation of electric charge at the electrode interface accompanying occurrence of an ion current causes deterioration of various characteristics such as imprint characteristics, retention characteristics, and fatigue characteristics.

However, according to the invention, the neutrality of the entire crystal structure can be maintained by replacing Pb in the A site of PZT with Bi having a valence higher than that of Pb. As a result, occurrence of oxygen deficiency can be prevented. This prevents occurrence of leakage current from the ferroelectric film 101. Moreover, the characteristics of the ferroelectric film 101, such as imprint characteristics, retention characteristics, and fatigue characteristics, can be improved.

Since Bi has strong-covalent bonding properties with oxygen in comparison with Pb, Bi does not easily leave the crystal. The degree of covalent bonding properties is determined by the relative values of the orbital levels of atoms which bond with each other. In the perovskite type structure, as the 6 p orbital level of the atom which enters the A site becomes closer to the 2 p orbital level of oxygen, the orbitals of the A-site atom and the orbitals of the oxygen atom closest to the A site tend to be hybridized, so that Bi does not easily leave the crystal in comparison with Pb. This also prevents occurrence of leakage current from the ferroelectric film 101. Since the 6 p orbital of Bi is an unoccupied molecular orbital in the A site of the perovskite type structure, the 6 p orbital contributes to an increase in the covalent bonding properties.

Figure 3:
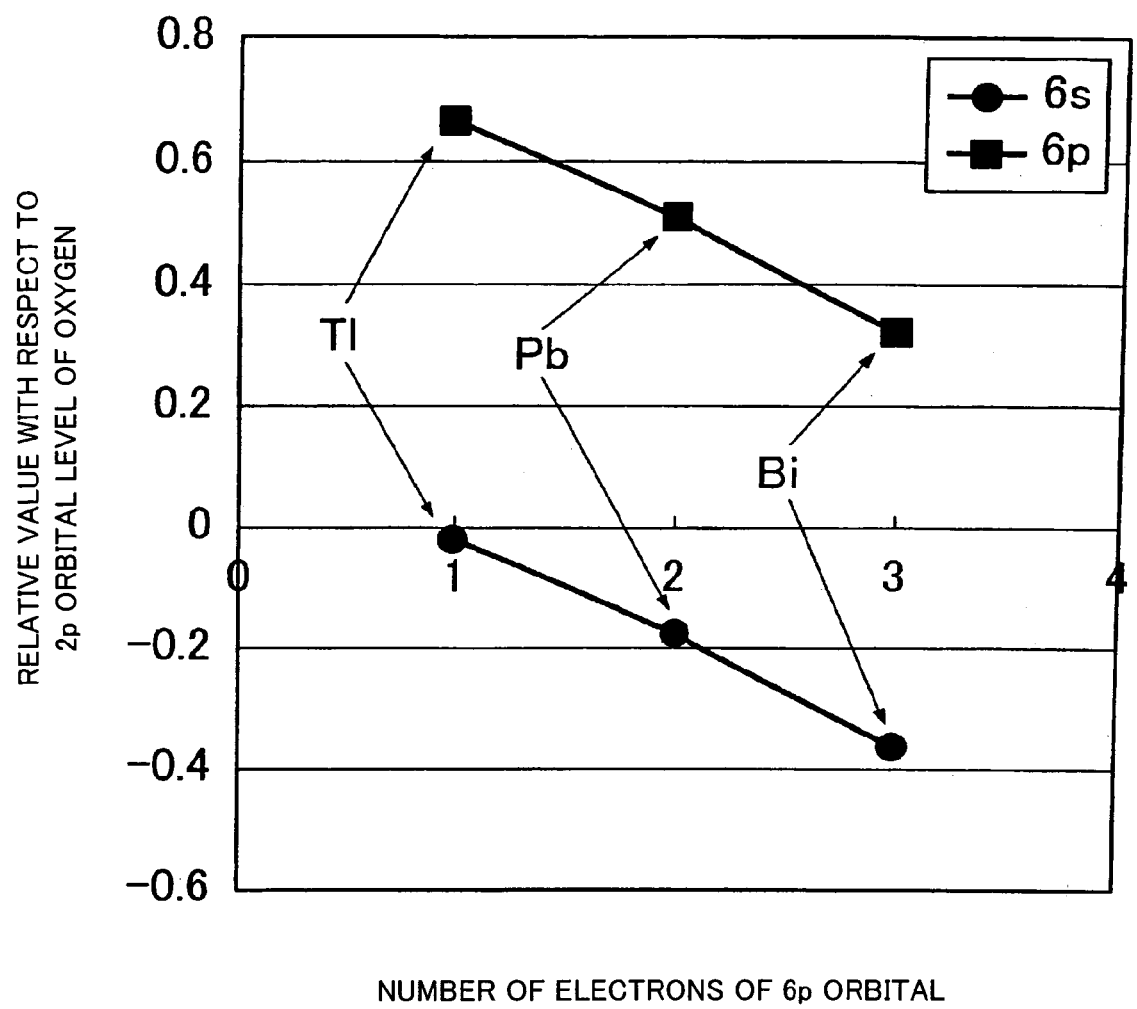
FIG. 3 shows relative values of 6 p orbital levels of Bi and Pb.

FIG. 3 shows the relative values of the 6 p orbital levels of Bi and Pb with respect to the 2 p orbital level of an oxygen atom. The relative values of the 6 p orbital levels of Bi and Pb are values based on the orbital energy level of each atom determined by first-principles calculation based on the density functional theory. The 6 p orbital level of Bi is closer to the 2 p orbital level of oxygen than the 6 p orbital level of Pb. The covalent bonding properties with oxygen are increased as the 6 p orbital level of an atom which enters the A site becomes closer to the 2 p orbital level of oxygen. The ferroelectricity of the ferroelectric film 101, such as the Curie temperature and the polarization moment, is increased as the covalent bonding properties between the A-site atom and an oxygen atom are increased. Since the 6 s orbitals of Bi and Pb are occupied molecular orbitals in the A site, the 6 s orbitals neither effectively contribute to the covalent bond properties nor increase the ferroelectricity.

X is added in the range of preferably "$0.10 \leq a \leq 0.30$", and still more preferably "$0.20 \leq a \leq 0.25$".

When X is an element having a valence of +5, X may be Nb, Ta, or the like. It is preferable that X be Nb.

When Nb is added in the range of "$0<a 0.2$", the ferroelectric film 101 becomes a perovskite type single-phase film, in which Nb is positioned in the B site of the perovskite type structure.

Bi is added in the range of preferably "$0<d \leq 0.5$", and still more preferably "$0.05 \leq d \leq 0.30$".

When Bi is added in the range of "$0<d \leq 0.2$", the ferroelectric film 101 becomes a perovskite type single-phase film, in which Bi is positioned in the A site of the perovskite type structure.

Figure 4:
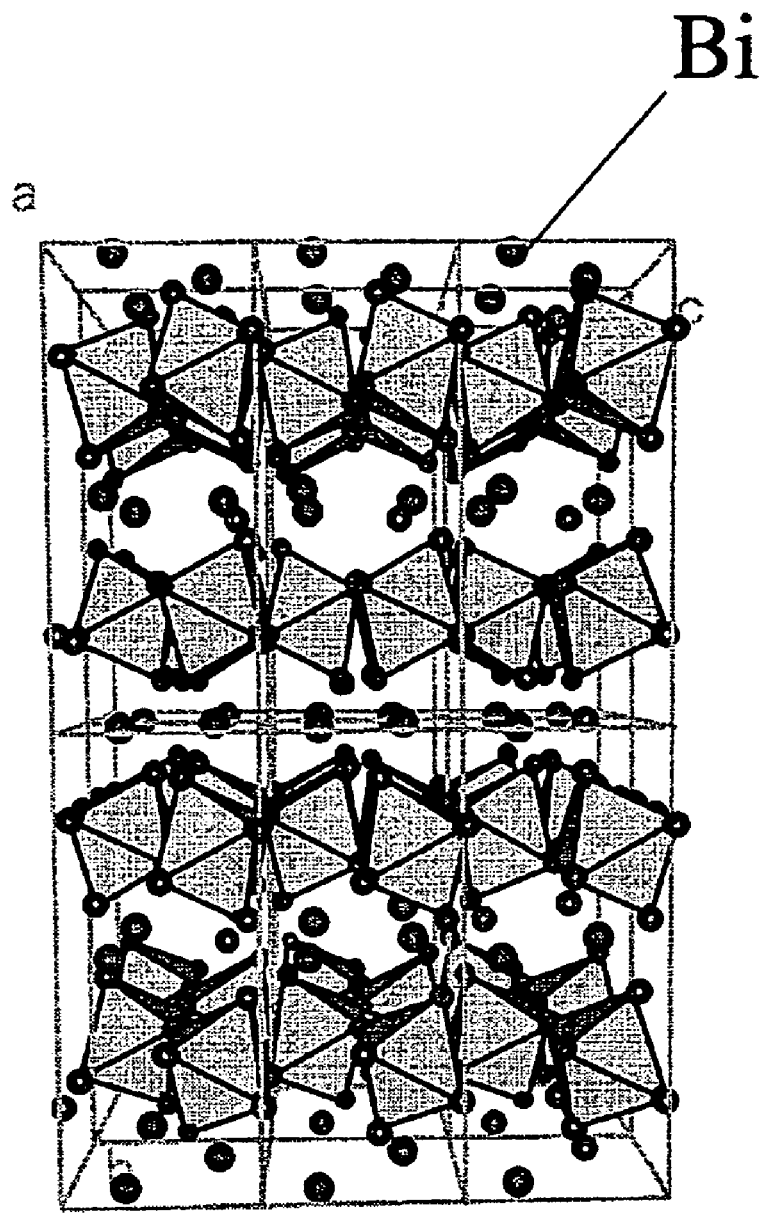
FIG. 4 is illustrative of a Bi-layered perovskite type crystal structure.

When Bi is added in the range of "$0.3 \leq d<1$", the ferroelectric film 101 includes not only a crystal shown by the general formula (1) but also a crystal of $BiNbO_4$. This is because the solubility limit is exceeded as the amounts of Nb and Bi added are increased, so that some of Nb and Bi added do not enter the B site or the A site of the perovskite type structure. As a result, the ferroelectric film 101 includes an eutectic of a crystal shown by the general formula (1) and a crystal of $BiNbO_4$. The crystal of $BiNbO_4$ has a bismuth-layered perovskite type structure as shown in FIG. 4.

The thickness of the ferroelectric film 101 is about 50 to 150 nm, for example.

As a specific example of the crystal shown by the general formula (1), $(Pb_{1-d}Bi_d)(Zr,Ti)_{1-a}Nb_aO_3$ can be given. $(Pb_{1-d}Bi_d)(Zr,Ti)_{1-a}Nb_aO_3$ is obtained by adding Nb and Bi to $Pb(Zr_{1-p}Ti_p)O_3$ (hereinafter may be called "PZT") having a perovskite type crystal structure.

The amount of Nb added is indicated by "a" in the above formula. The amount of Bi added is indicated by "d" in the above formula. It is preferable that "p" indicating the compositional ratio of Zr to Ti be in the range of "$0.3 \leq p \leq 1.0$", and still more preferably "$0.5 \leq p \leq 0.8$".

In the general formula (1) shown by $(Pb_{1-d}Bi_d)(B_{1-a}X_a)O_3$, the A-site atom is not deficient. However, the A-site atom may be caused to be deficient. In this case, the compositional formula is shown by the general formula $(Pb_{1-d}Bi_d)_{1-b}(B_{1-a}X_a)O_3$. The amount of deficiency "b" in the A site, "a", and "d" satisfy the relational expression "b=(a+d)/(2+d)".

"a" is in the range of "$0.05 \leq a \leq 0.4$", and "d" is in the range of "$0<d<1$".

In addition, oxygen deficiency may be caused to occur. In this case, the compositional formula is shown by $(Pb_{1-d}Bi_d)_{1-b}(B_{1-a}X_a)O_{3-c}$, in which "a", "b", "c", and "d" satisfy the relational expression "b=(a+d+2c)/(2+d)", and the amount of oxygen deficiency "c" is in the range of "$0 \leq c \leq 0.05$", and preferably "$0<c \leq 0.03$". "a" is in the range of "$0.05 \leq a \leq 0.4$", and "d" is in the range of "$0<d<1$".

2. Method of Manufacturing Ferroelectric Film and Ferroelectric Capacitor

A method of manufacturing a ferroelectric film and a ferroelectric capacitor according to one embodiment of the invention is described below.

The substrate 10 is provided. As the material for the substrate 10, silicon or the like may be used.

The first electrode 102 is formed on the substrate 10. It is preferable that the first electrode 102 be formed of a metal oxide having a perovskite type structure. An excellent crystal is easily grown by forming the ferroelectric film 101 over the first electrode 102 having a perovskite type structure. This prevents occurrence of leakage current from the ferroelectric film 101.

The first electrode 102 may be formed by using a laser ablation method or the like. Specifically, a target containing a desired electrode material is provided. Then, atoms including an oxygen atom and a metal atom are scattered from the target by applying laser light to the target to cause a plume to occur. The plume is emitted toward the substrate 10 and caused to come in contact with the substrate 10. As a result, the first electrode 102 is epitaxially grown on the substrate 10.

As the material for the first electrode 102 having a perovskite type structure, $SrRuO_3$, Nb—$SrTiO_3$, La—$SrTiO_3$, Nb—$(La,Sr)CoO_3$, $LaNiO_3$, $PbBaO_3$, or the like may be used. Nb—$SrTiO_3$ is obtained by doping $SrTiO_3$ with Nb, La—$SrTiO3$ is obtained by doping $SrTiO_3$ with La, and Nb—$(La,Sr)CoO_3$ is obtained by doping $(La,Sr)CoO_3$ with Nb. The first electrode 102 need not have a perovskite type structure, and may be formed by using Pt, Ir, or $IrO_x$.

As the formation method for the first electrode 102, an ion beam assist method, a sputtering method, a vacuum deposition method, or the like may be used instead of the laser ablation method.

Then, the ferroelectric film 101 is formed on the first electrode 102.

A sol-gel raw material including a hydrolysis-condensation product of a metal alkoxide containing at least Zr and Ti, a polycarboxylic acid or a polycarboxylic acid ester, and an organic solvent are mixed, and a ferroelectric precursor solution including an ester bond is formed by esterification of the polycarboxylic acid or a polycarboxylic acid derived from the polycarboxylic acid ester and the metal alkoxide.

Figure 5:
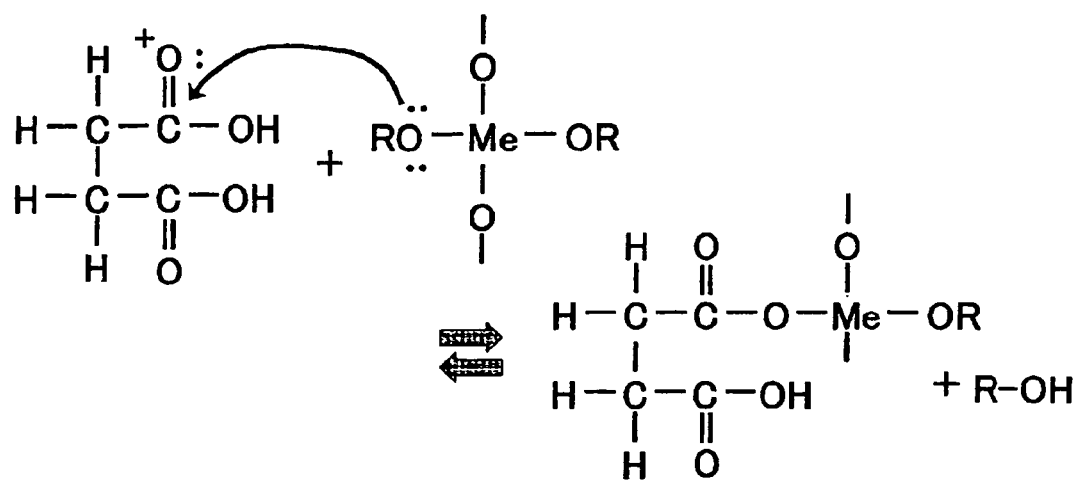
FIG. 5 shows a formation reaction of a precursor solution of a ferroelectric film according to one embodiment of the invention.
Figure 6:
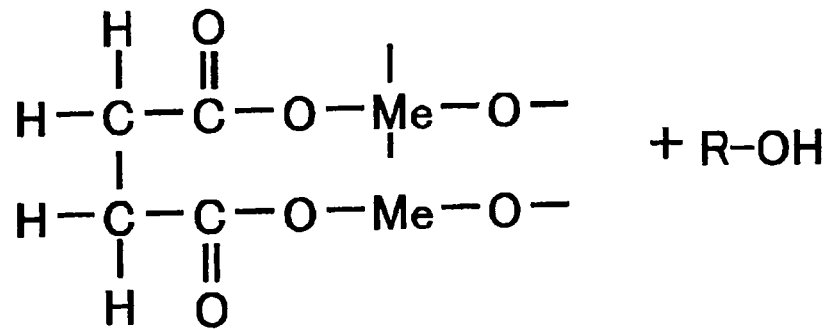
FIG. 6 shows a formation reaction of a precursor solution of a ferroelectric film according to one embodiment of the invention.

The precursor solution formation reaction is roughly divided into a first-stage alkoxy group substitution reaction as shown in FIG. 5, and a second-stage polymer network formation reaction by esterification as shown in FIG. 6. FIGS. 5 and 6 show an example of using dimethyl succinate as the polycarboxylic acid ester and n-butanol as the organic solvent. Although dimethyl succinate is nonpolar, dimethyl succinate dissociates in an alcohol to produce a dicarboxylic acid.

In the first-stage reaction, dimethyl succinate and the metal alkoxide of the sol-gel raw material undergo esterification and are bonded through an ester bond, as shown in FIG. 5. Specifically, dimethyl succinate dissociates in n-butanol so that one of the carbonyl groups (first carbonyl group) is protonated. A substitution reaction occurs between the first carbonyl group and the alkoxy group of the metal alkoxide to produce a reaction product, in which the first carboxyl group is esterified, together with an alcohol. The "ester bond" used herein means a bond (—COO—) formed by a carbonyl group and an oxygen atom.

In the second-stage reaction, a substitution reaction occurs between the carboxyl group (second-carboxyl group) remaining unreacted in the first-stage reaction and the alkoxy group of the metal alkoxide to produce a reaction product, in which the second carboxyl group is esterified, together with an alcohol, as shown in FIG. 6.

A polymer network in which the hydrolysis-condensation products of the metal alkoxide included in the sol-gel raw material are bonded through ester bonds is obtained by the above two-stage reaction. Therefore, the polymer network includes a moderate amount of ester bond in the network. Since dimethyl succinate dissociates in two stages and the first carboxyl group has an acid dissociation constant greater than the acid dissociation constant of the second carboxyl group, the first-stage reaction has a rate of reaction higher than the rate of reaction of the second-stage reaction. Therefore, the second-stage reaction proceeds more slowly than the first-stage reaction.

According to one embodiment of the invention, any of the following methods may be used to promote the esterification reaction.

The concentration or reactivity of the reaction product may be increased. In more detail, the reactivity is increased by increasing the degree of dissociation of the polycarboxylic acid or the polycarboxylic acid ester by increasing the temperature of the reaction system. It is preferable that the temperature of the reaction system be higher than room temperature and lower than the boiling point of the organic solvent, although the temperature of the reaction system varies depending on the boiling point of the organic solvent. The temperature of the reaction system may be 100° C. or less, and preferably 50 to 100° C., for example.

A reaction by-product may be removed. In more detail, esterification is promoted by removing water and an alcohol produced along with esterification.

The molecular motion of the reaction product may be physically accelerated. In more detail, the reactivity of the reaction product is increased by applying energy rays such as ultraviolet rays.

The organic solvent used in the method of manufacturing a ferroelectric film according to the embodiment may be an alcohol. The sol-gel raw material and the polycarboxylic acid or the polycarboxylic acid ester can be efficiently dissolved by using an alcohol as the solvent. The alcohol is not particularly limited. As examples of the alcohol, monohydric alcohols such as butanol, methanol, ethanol, and propanol, and polyhydric alcohols can be given. Specific examples of the alcohol are given below.

Monohydric alcohol:

Propanol (propyl alcohol): 1-propanol (boiling point: 97.4° C.) and 2-propanol (boiling point: 82.7° C.)

Butanol (butyl alcohol): 1-butanol (boiling point: 117° C.), 2-butanol (boiling point: 100° C.), 2-methyl-1-propanol (boiling point: 108° C.), and 2-methyl-2-propanol (melting point: 25.4° C., boiling point: 83° C.)

Pentanol (amyl alcohol): 1-pentanol (boiling point: 137° C.), 3-methyl-1-butanol (boiling point: 131° C.), 2-methyl-1-butanol (boiling point: 128° C.), 2,2-dimethyl-1-propanol (boiling point: 113° C.), 2-pentanol (boiling point: 119° C.), 3-methyl-2-butanol (boiling point: 112.5° C.), 3-pentanol (boiling point: 117° C.), and 2-methyl-2-butanol (boiling point: 102° C.)

Polyhydric alcohol:

Ethylene glycol (melting point: −11.5° C., boiling point: 197.5° C.) and glycerol (melting point: 17° C., boiling point: 290° C.)

It is preferable that the polycarboxylic acid or the polycarboxylic acid ester be a dicarboxylic acid or a dicarboxylic acid ester.

The amount of polycarboxylic acid or polycarboxylic acid ester used is adjusted depending on the compositional ratio of the sol-gel raw material and the ferroelectric. The ratio of the total molar ion concentration of-the PZT sol-gel raw material, PbNb sol-gel raw material, and PbSi sol-gel raw material, to which the polycarboxylic acid is bonded, to the molar ion concentration of the polycarboxylic acid is set at preferably "1≧(molar ion concentration of polycarboxylic acid)/(total molar ion concentration of raw material solution)", and still more preferably 1:1. The polycarboxylic acid may be added in an amount of 0.35 mol, for example.

It is preferable that the amount of polycarboxylic acid or polycarboxylic acid ester added be equal to or greater than the total number of moles of the raw material solution. All the raw materials bond when the molar ion concentration ratio is 1:1. However, since an ester stably exists in an acidic solution, it is preferable to add the polycarboxylic acid in excess to the total number of moles of the raw material solution in order to allow an ester to stably exist. The number of moles of the polycarboxylic acid or the polycarboxylic acid ester used herein refers to the number of carboxyl groups. Specifically, when using a dicarboxylic acid or a dicarboxylic acid ester, one molecule of the dicarboxylic acid or the dicarboxylic acid ester can bond to two raw material molecules. Therefore, the ratio is 1:1 when the amount of dicarboxylic acid or dicarboxylic acid ester is 0.5 mol for one mol of the raw material solution. The polycarboxylic acid ester does not initially function as an acid. The polycarboxylic acid ester produces a polycarboxylic acid when caused to dissociate in an alcohol. In this case, it is preferable that the number of moles of alcohol added be "1≧(number of moles of alcohol/number of moles of polycarboxylic acid ester)". This is because the polycarboxylic acid ester more sufficiently and stably dissociates as the number of moles of alcohol is greater. The number of moles of alcohol used herein refers to a molar ion concentration obtained by dividing the number of moles by the number of hydroxyl groups.

In this method of manufacturing a ferroelectric film, a raw material including a metal carboxylate may be mixed. As examples of the metal carboxylate, the above-mentioned lead carboxylate such as lead acetate and lead octylate can be given.

Figure 7:
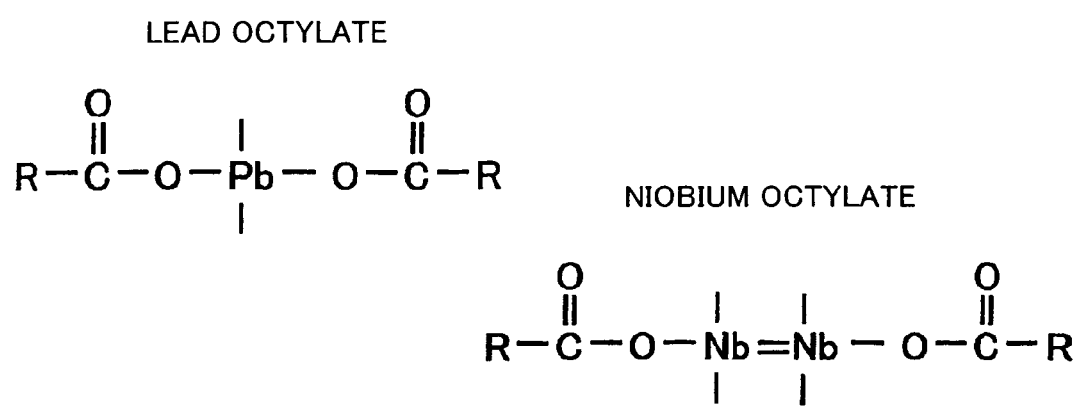
FIG. 7 shows metal carboxylates used in one embodiment of the invention.

In this method of manufacturing a ferroelectric film, an organometallic compound (MOD raw material) may be used together with the sol-gel raw material. As the organometallic compound, niobium octylate may be used, for example. As shown in the FIG. 7, niobium octylate has a structure in which two Nb atoms form a covalent bond and an octyl group exists in the remaining site. In this case, since the network other than the two Nb atoms does not exist, niobium octylate is regarded as the MOD raw material.

A network is formed between the carboxylic acid and the MOD raw material mainly through an alcohol exchange reaction. When using niobium octylate, a reaction occurs between the carboxylic acid and the octyl group (alcohol exchange reaction), so that esterification (R—COO—Nb) proceeds. As described above, according to one embodiment of the invention, the molecules of the MOD raw material can be bonded to the precursor network through condensation between the MOD raw material and the alkoxide by esterifying the MOD raw material.

In this method of manufacturing a ferroelectric film, a sol-gel raw material including Si or Si and Ge may be used as the sol-gel raw material including the hydrolysis-condensation product of the metal alkoxide. As such a sol-gel solution, a $PbSiO_3$ sol-gel solution or a combination of a $PbSiO_3$ sol-gel solution and a $PbGeO_3$ sol-gel may be used. The deposition temperature can be reduced by using the sol-gel raw material including Si or Ge, whereby a ferroelectric can be crystallized at a temperature as low as about 450° C.

In this method of manufacturing a ferroelectric film, PZTN may be obtained by using a solution prepared by mixing at least a $PbZrO_3$ sol-gel solution, a $PbTiO_3$ sol-gel solution, and a $PbNbO_3$ sol-gel solution as the sol-gel solution. In this case, a sol-gel raw material including Si or Si and Ge may also be mixed.

When introducing Ta instead of Nb, a $PbTaO_3$ sol-gel solution may be used as the sol-gel raw material.

Since the precursor of the precursor composition obtained according to one embodiment of the invention includes a moderate amount of ester bond between molecular networks, a reversible reaction can occur. Therefore, the polymerized precursor (polymer network) may be decomposed into the metal alkoxide condensate by causing the reaction in the left direction shown in FIG. 5 to occur.

According to the method of manufacturing the ferroelectric film 101 according to one embodiment of the invention, a polymer network in which the hydrolysis-condensation products (molecular networks) of the metal alkoxide of the sol-gel raw material are bonded through ester bonds is obtained in the organic solvent by using the polycarboxylic acid. Therefore, the polymer network includes a moderate amount of ester bond between the molecular networks derived from the hydrolysis-condensation products. The esterification reaction can be easily carried out by controlling the temperature or the like.

Since the precursor composition according to one embodiment of the invention includes a moderate amount of ester bond between the molecular networks, a reversible reaction can occur. Therefore, the polymerized precursor (polymer network) can be decomposed into the metal alkoxide (or molecular network of the condensation product) in the composition remaining after deposition of a ferroelectric film. Since the metal alkoxide (or molecular network of the condensation product) can be recycled as the precursor raw material, a toxic substance such as lead can be recycled. Therefore, it is advantageous from the viewpoint of environment.

In the ferroelectric capacitor, it is preferable that the ferroelectric film have a tetragonal structure and be pseudocubic (111) oriented in order to maintain the squareness of the hysteresis loop. This configuration eliminates the 90° domain in the ferroelectric film 101.

In order to form a ferroelectric capacitor having a pseudocubic (111) orientation, Pt having a (111) orientation may be used as the material for the first electrode 102. Or, a transition metal oxide having a perovskite type structure and a (111) orientation may be used as the material for the first electrode 102. As examples of such a transition metal oxide, $SrRuO_3$ and Nb-doped $SrTiO_3$ can be given. The ferioelectric film 101 can easily grow on the first electrode 102 having a (111) orientation while succeeding to the (111) orientation of the underlayer.

The ferroelectric film 101 can be formed by crystallizing the precursor solution by performing a heat treatment or the like.

In more detail, a series of steps consisting of a mixed solution coating step, an alcohol removal step, a drying heat treatment step, and a cleaning heat treatment step is performed a desired number of times, and the resulting product is sintered by crystallization annealing to form the ferroelectric film 101. The conditions in each step are as follows.

The mixed solution coating step is performed by applying the mixed solution by using a coating method such as spin coating. First, the mixed solution is applied dropwise to the first electrode 102. A spin operation is performed in order to spread the applied solution over the entire surface of the substrate. The rotational speed of the spin operation is about 500 rpm, for example. Then, the spin operation is performed at a lower rotational speed for a desired period of time so that the first electrode 102 is coated with the mixed solution. The rotational speed of this spin operation is set at 50 rpm or less, for example. The drying heat treatment step is performed at 150 to 180° C. The drying heat treatment is performed in air by using a hot plate or the like. The cleaning heat treatment step is performed in air on a hot plate maintained at 300 to 350° C., for example. The crystallization sintering step is performed in an oxygen atmosphere by rapid thermal annealing (RTA) or the like.

The thickness of the ferroelectric film 101 after sintering may be about 50 to 150 nm. The ferroelectric film 101 may be formed by using a sputtering method, a molecular beam epitaxy method, a laser ablation method, or the like.

Then, the second electrode 103 is formed on the ferroelectric film 101. The second electrode 103 may be formed by using a sputtering method, a vacuum deposition method, or the like. It is preferable to use a material mainly containing Pt as the material for the upper electrode. The material for the second electrode 103 is not limited to Pt. A known electrode material such as fr, $IrO_x$, $SrRuO_3$, Nb—$SrTiO_3$, La—$SrTiO_3$, Nb—$(La,Sr)CoO_3$, $LaNiO_3$, or $PbBaO_3$ may also be used.

Then, post annealing may be optionally performed in an oxygen atmosphere by RTA or the like. This enables an excellent interface to be formed between the second electrode 103 and the ferroelectric film 101 and improves the crystallinity of the ferroelectric film 101.

The ferroelectric film 101 and the ferroelectric capacitor 100 according to one embodiment of the invention can be manufactured by the above-described steps.

According to the ferroelectric capacitor 100 of one embodiment of the invention, the crystallization temperature can be reduced, and the hysteresis squareness can be improved. An improvement of the hysteresis squareness by the ferroelectric capacitor 100 has an effect on stability against a disturbance, which is important for driving a simple matrix type ferroelectric memory device.

3. Ferroelectric Memory

Figure 8A:
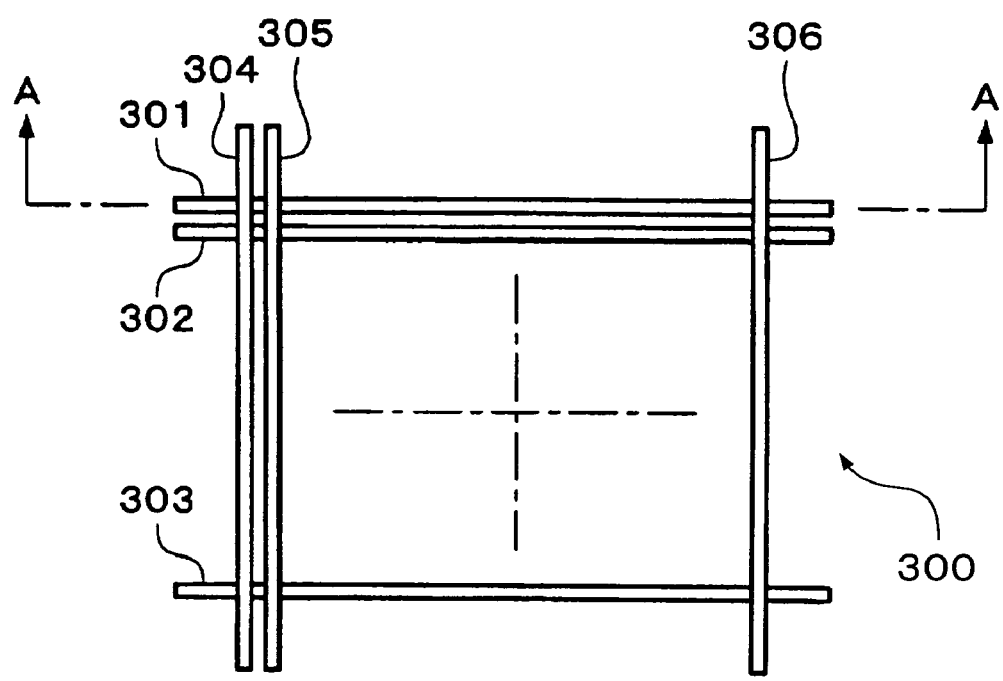
FIGS. 8A and 8B are a plan view and a cross-sectional diagram respectively schematically showing a simple matrix type ferroelectric memory device according to one embodiment of the invention.
Figure 8B:
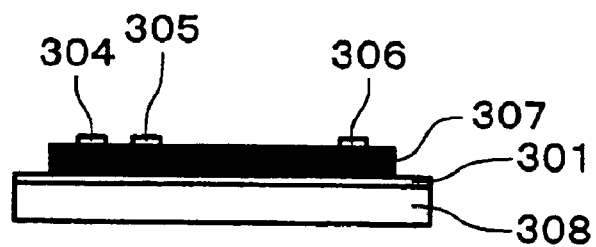

FIGS. 8A and 8B are diagrams showing a configuration of a simple matrix type ferroelectric memory device 300 according to one embodiment of the invention. FIG. 8A is a plan view of the ferroelectric memory device 300, and FIG. 8B is a cross-sectional diagram along the line A-A shown in FIG. 8A. As shown in FIGS. 8A and 8B, the ferroelectric memory device 300 includes a specific number of wordlines 301 to 303 formed on a substrate 308, and a specific number of bitlines 304 to 306. A ferroelectric film 307 described in the above-described embodiment is inserted between the wordlines 301 to 303 and the bitlines 304 to 306, so that ferroelectric capacitors are formed in the intersecting regions of the wordlines 301 to 303 and the bitlines 304 to 306.

In the ferroelectric memory device 300 in which memory cells are arranged in a simple matrix, data is written into or read from the ferroelectric capacitors formed in the intersecting regions of the wordlines 301 to 303 and the bitlines 304 to 306 by using a peripheral driver circuit, a read amplifier circuit, and the like (not shown) (hereinafter collectively called "peripheral circuit"). The peripheral circuit may be formed by MOS transistors on a substrate differing from the substrate of the memory cell array and connected with the wordlines 301 to 303 and the bitlines 304 to 306. The peripheral circuit and the memory cell array may be integrated on a single substrate by using a single-crystal silicon substrate as the substrate 308.

Figure 9:
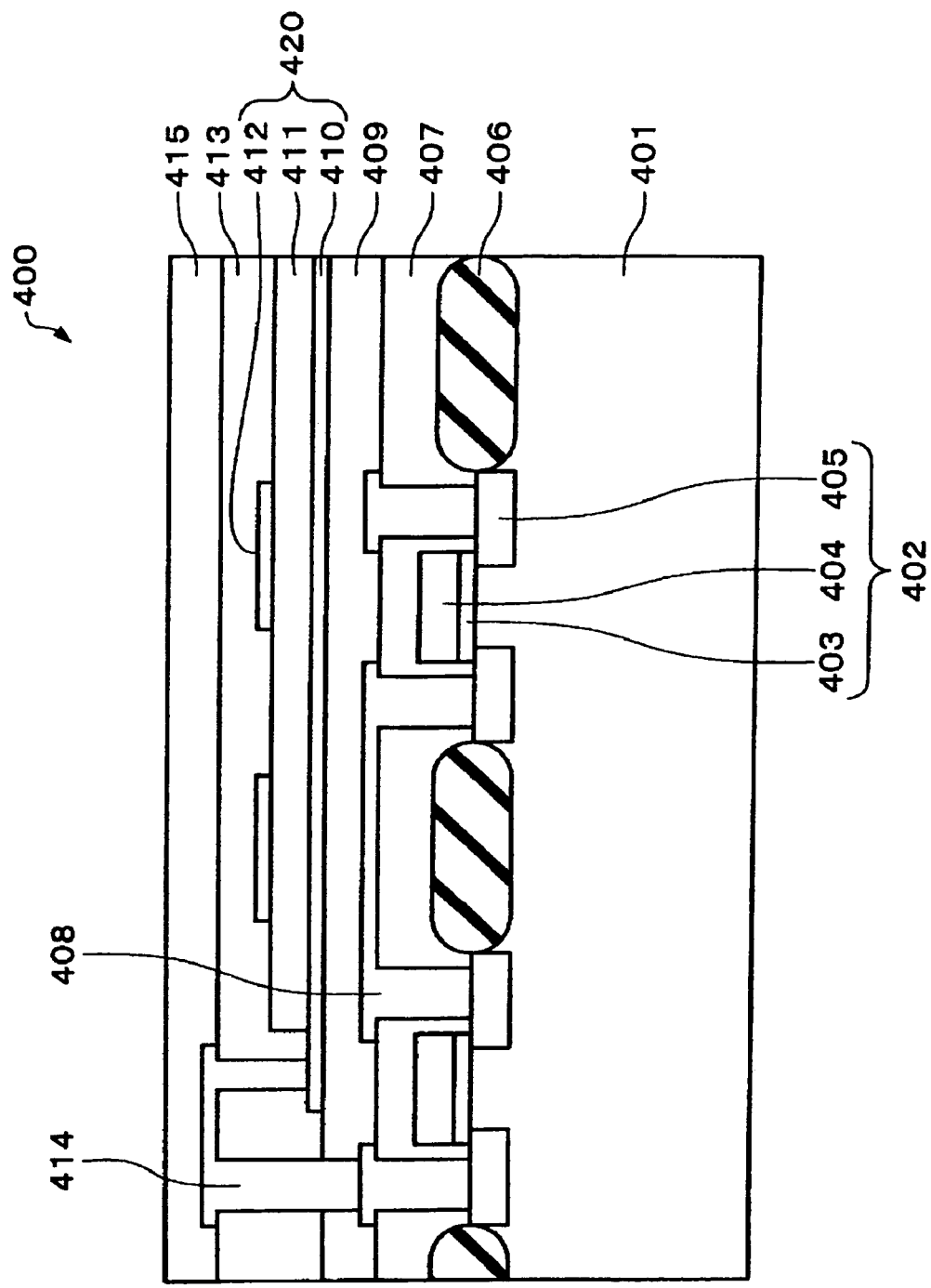
FIG. 9 is a cross-sectional diagram showing an example of a ferroelectric memory device according to one embodiment of the invention in which a memory cell array and a peripheral circuit are integrated on a single substrate.

FIG. 9 is a cross-sectional diagram showing an example of a ferroelectric memory device 400 in which a memory cell array and a peripheral circuit are integrated on a single substrate.

In FIG. 9, MOS transistors 402 are formed on a single-crystal silicon substrate 401, and the transistor formation region corresponds to a peripheral circuit section. The MOS transistor 402 is formed by the single-crystal silicon substrate 401, source/drain regions 405, a gate insulating film 403, and a gate electrode 404. The ferroelectric memory device 400 includes an element isolation oxide film 406, a first interlayer dielectric 407, a first interconnect layer 408, and a second interlayer dielectric 409.

The ferroelectric memory device 400 includes a memory cell array including ferroelectric capacitors 420. The ferroelectric capacitor 420 includes a lower electrode 410 (first electrode or second electrode) functioning as a wordline or a bitline, a ferroelectric film 411 including a ferroelectric phase and a paraelectric phase, and an upper electrode 412 (second electrode or first electrode) formed on the ferroelectric film 411 and functioning as the bitline or the wordline.

The ferroelectric memory device 400 includes a third interlayer dielectric 413 formed over the ferroelectric capacitor 420. The memory cell array is connected with the peripheral circuit section through a second interconnect layer 414. In the ferroelectric memory device 400, a protective film 415 is formed over the third interlayer dielectric 413 and the second interconnect layer 414.

According to the ferroelectric memory device 400 having the above-described configuration, the memory cell array and the peripheral circuit section can be integrated on a single substrate. The ferroelectric memory device 400 shown in FIG. 9 has a configuration in which the memory cell array is formed over the peripheral circuit section. However, the ferroelectric memory device 400 may have a configuration in which the memory cell array is not disposed over the peripheral circuit section and is adjacent to the peripheral circuit section in the horizontal direction.

Since the ferroelectric capacitor 420 used in one embodiment of the invention includes the ferroelectric film according to the above-described embodiment, the ferroelectric capacitor 420 exhibits excellent hysteresis squareness and has stable disturbance characteristics. Moreover, since the ferroelectric capacitor 420 allows a decrease in process temperature, damage to the peripheral circuit and other elements is reduced. Furthermore, since process damage (particularly reduction by hydrogen) occurs to only a small extent, deterioration of the hysteresis due to damage can be prevented. Therefore, the simple matrix type ferroelectric memory device 300 can be put into practical use by using the ferroelectric capacitor 420.

Figure 10A:
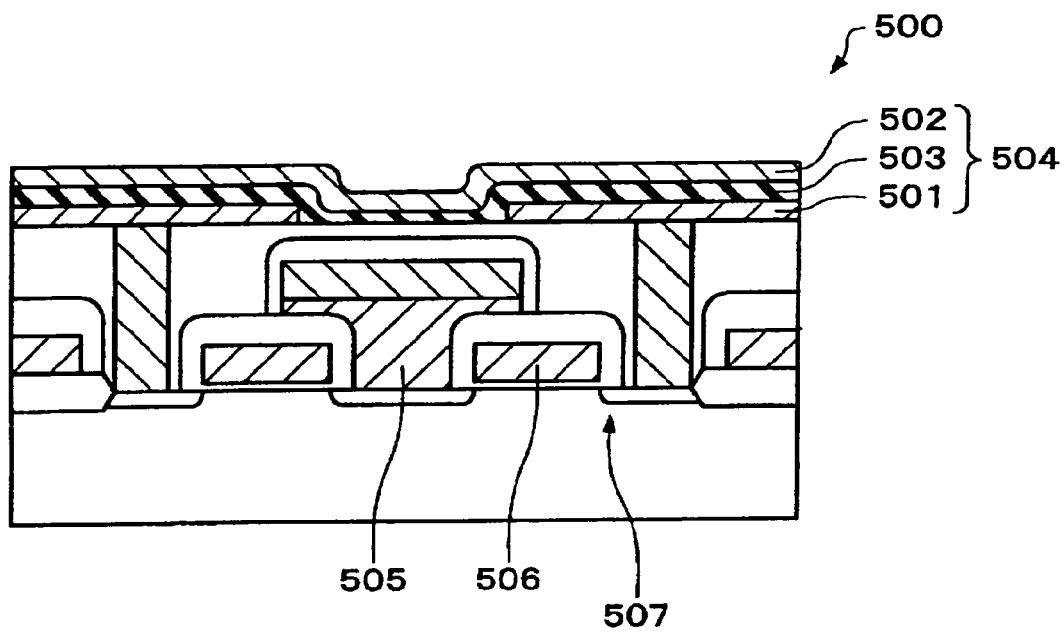
FIGS. 10A and 10B are a cross-sectional diagram and an equivalent circuit diagram respectively schematically showing a 1T1C type ferroelectric memory according to a modification of one embodiment of the invention.
Figure 10B:
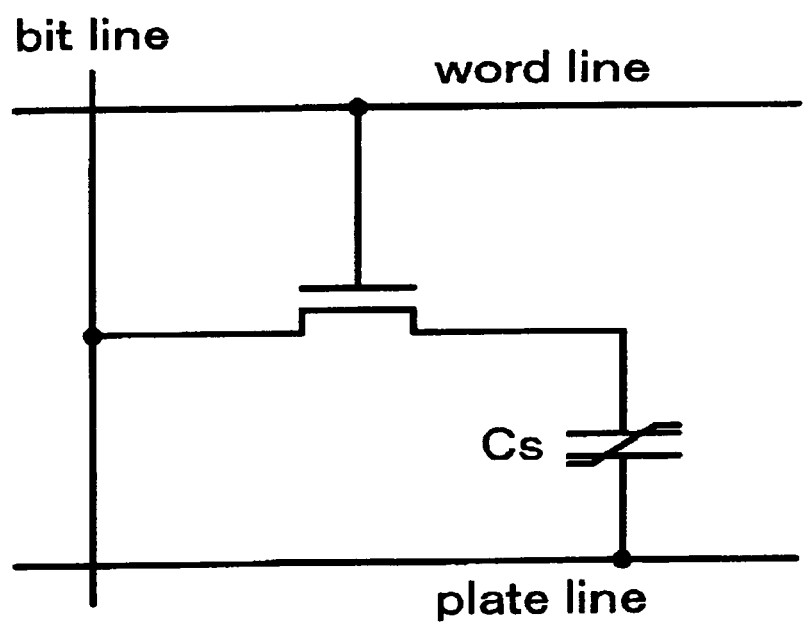

FIG. 10A is a structural diagram of a 1T1C type ferroelectric memory device 500 as a modification. FIG 10B is an equivalent circuit diagram of the ferroelectric memory device 500.

As shown in FIG 10A, the ferroelectric memory device 500 is a memory device having a structure similar to that of a DRAM, and includes a capacitor 504 (1C) including a lower electrode 501, an upper electrode 502 connected with a plate line, and a ferroelectric film 503 according to the above-described embodiment, and a switch transistor element 507 (1T) including source/drain electrodes, one of which is connected with a data line 505, and a gate electrode 506 connected with a wordline. Since the 1T1C type memory allows high-speed writing and reading (100 ns or less) and prevents volatilization of written data, the 1T1C type memory is expected to replace an SRAM or the like.

Examples of the embodiments of the invention are described above. However, the invention is not limited to the above-described embodiments. Various modifications and variations may be made within the scope of the invention.

4. Experimental Example

Experimental examples of the invention are described below.

4.1 Experimental Example 1

A ferroelectric film according to one embodiment of the invention was formed by using a raw material solution described below.

A solution prepared by dissolving a polycondensation product of lead acetate (Pb) and zirconium butoxide (Zr) for forming a PbZrO$_3$ perovskite crystal in a solvent such as n-butanol in an anhydrous state (hereinafter called "PZ solution") and a solution prepared by dissolving a polycondensation product of lead acetate (Pb) and titanium isopropoxide (Ti) for forming a PbTiO$_3$ perovskite crystal in a solvent such as n-butanol in an anhydrous state (hereinafter called "PT solution") were mixed so that the ratio of the PZ solution to the PT solution was 45:55 to prepare a solution 1.

Bismuth octylate and niobium octylate were mixed together with Si in a solvent such as n-butanol so that the molar ratio of bismuth octylate to niobium octylate was 1:1 to prepare a solution 2.

The solutions 1 and 2 were mixed with dimethyl succinate to prepare a raw material solution. Dimethyl succinate was mixed in an amount of 0.5 mol/l for 1 mol/l of the metal element concentration of each raw material solution. The raw material solution was then sealed and maintained at 90° C. for 30 min. The raw material solution was then cooled to room temperature to cause esterification to sufficiently proceed.

Figure 11:
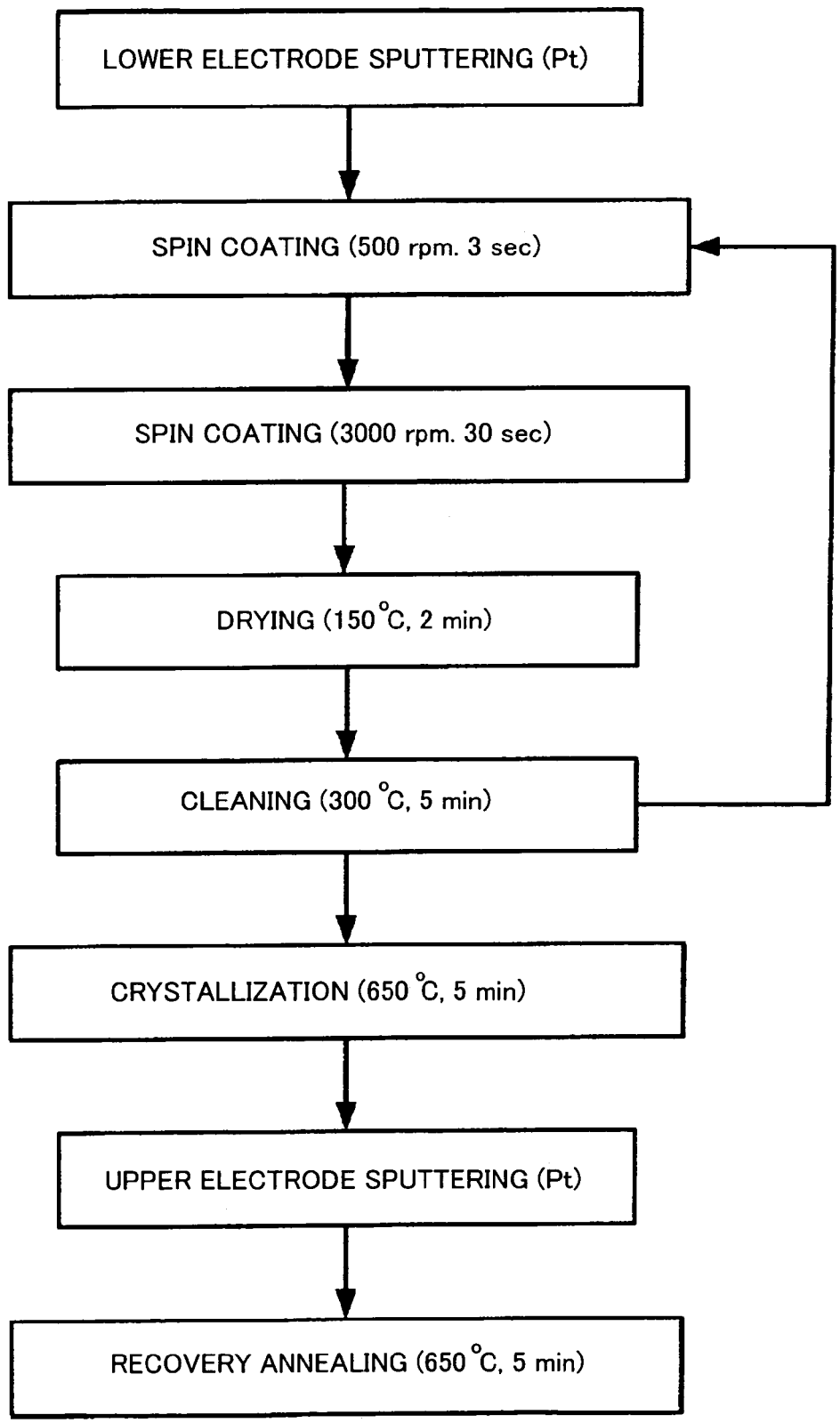
FIG. 11 shows a sample formation method in an experimental example according to one embodiment of the invention.

The ratio of the solution 1 to the solution 2 was as follows.
Raw material solution 1: solution 1/solution 2=100/0
Raw material solution 2: solution 1/solution 2=95/5
Raw material solution 3: solution 1/solution 2=90/10
Raw material solution 4: solution 1/solution 2=80/20
Samples were prepared by using the raw material solutions 1 to 4 according a method shown in FIG. 11.

Specifically, a platinum lower electrode was formed by using a sputtering method. The raw material solution was applied to a substrate by using a spin coating method, and dried at 150 to 180° C. (150° C.) by using a hot plate to remove the alcohol. Then, a cleaning heat treatment was performed at 300 to 350° C. (300° C.) by using a hot plate. Then, the coating step, the drying treatment step, and the cleaning heat treatment step were optionally performed (three times in total) to obtain a coating film having a desired thickness. The coating film was then subjected to crystallization annealing (sintering) to obtain a ferroelectric film sample having a thickness of 150 nm. Crystallization sintering was performed in an oxygen atmosphere at 650 to 700° C. (650° C.) by rapid thermal annealing (RTA). Then, a platinum upper electrode was formed by using a sputtering method, and recovery annealing was performed at 650 to 700° C. (650° C.) by RTA to obtain a ferroelectric capacitor sample (hereinafter also called "capacitor sample").

The following characteristics were examined by using the resulting samples.

Figure 12:
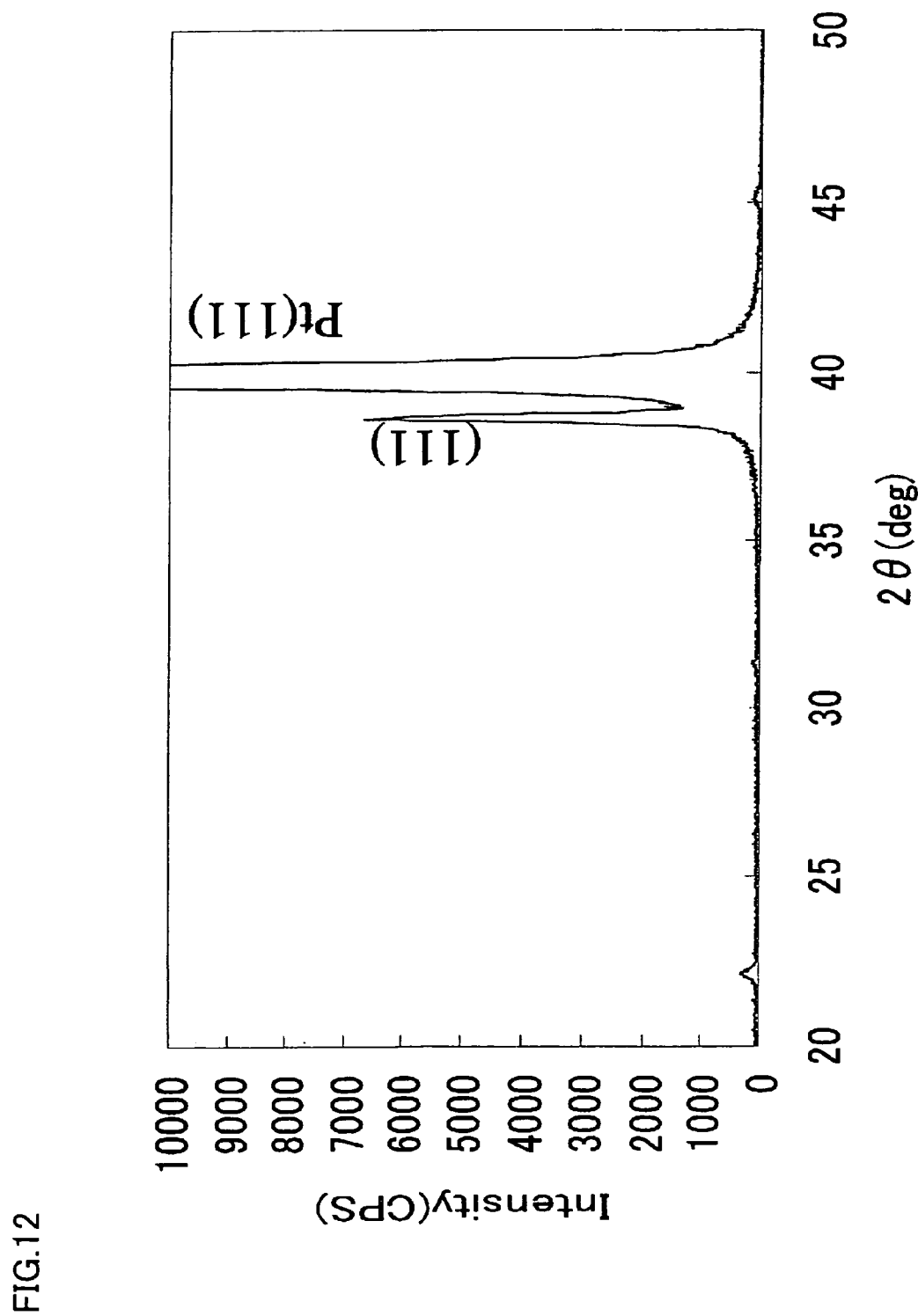
FIG. 12 shows crystallinity of a ferroelectric film sample obtained by using a raw material solution 2.
Figure 13:
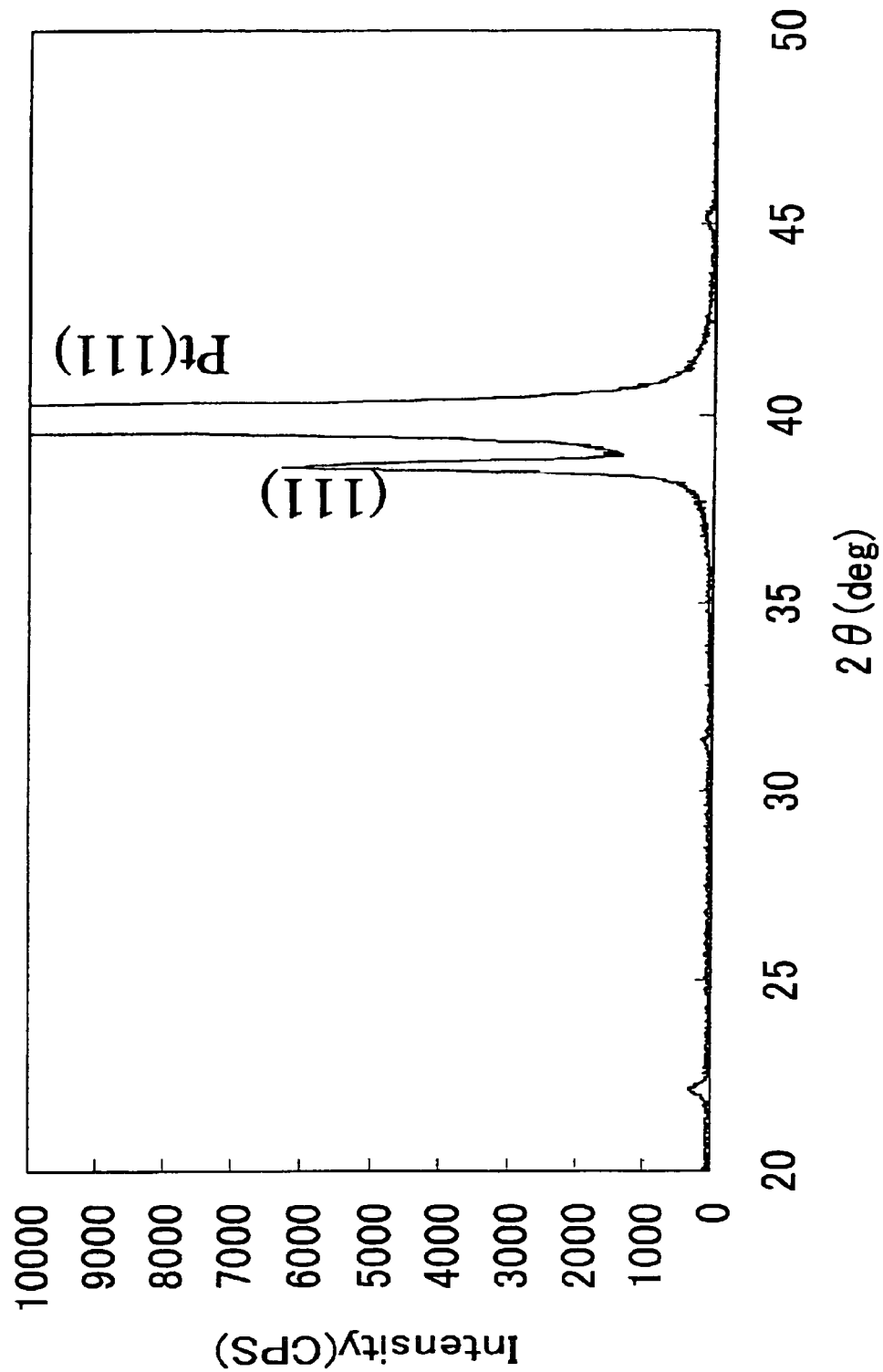
FIG. 13 shows crystallinity of a ferroelectric film sample obtained by using a raw material solution 3.
Figure 14:
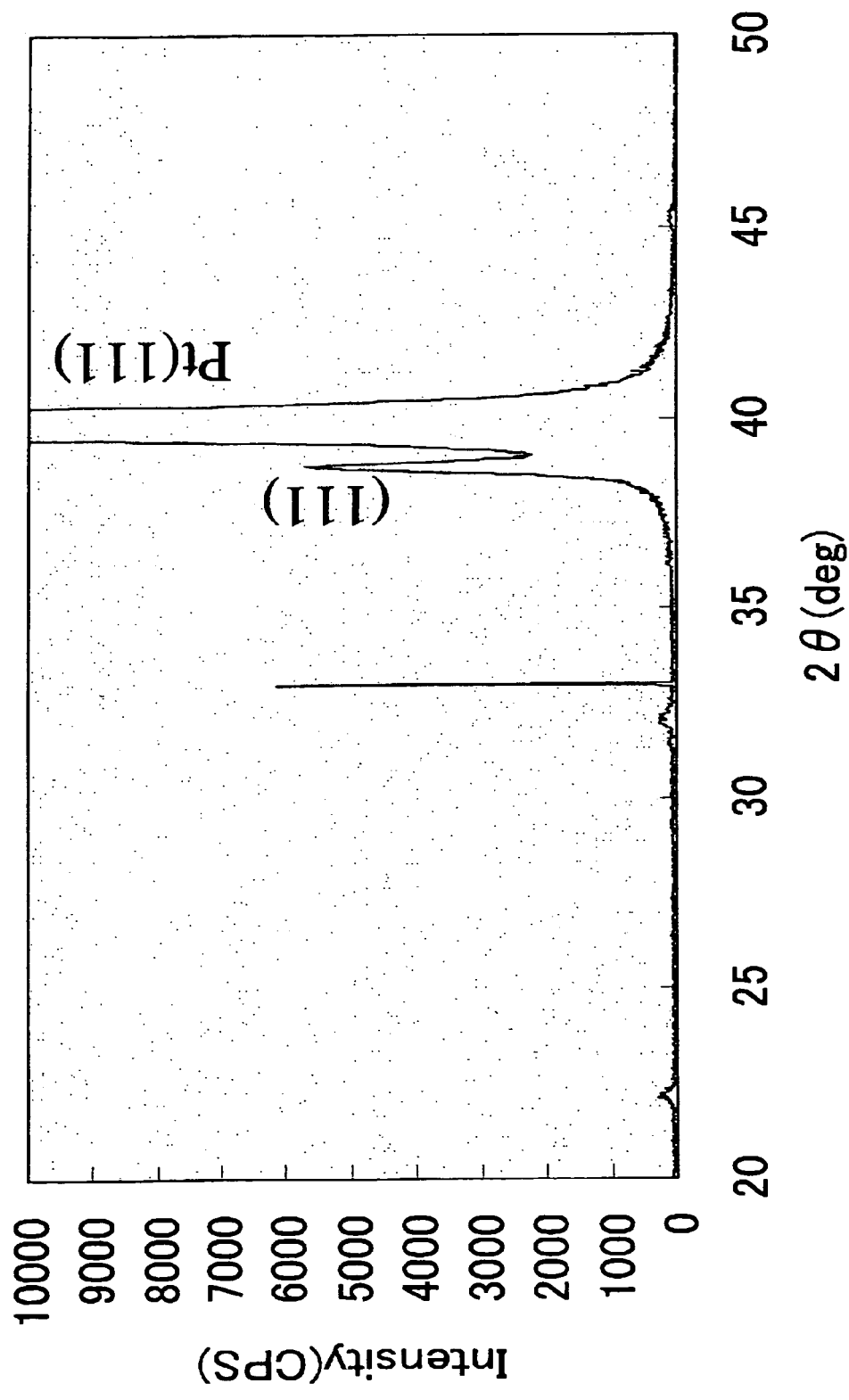
FIG. 14 shows crystallinity of a ferroelectric film sample obtained by using a raw material solution 4.

The crystallinity of three ferroelectric film samples obtained by using the raw material solutions 2 to 4 was examined by X-ray diffraction analysis. The results are shown in FIGS. 12 to 14. FIG. 12 is a diagram showing the crystallinity of the ferroelectric film sample obtained by using the raw material solution 2. FIG. 13 is a diagram showing the crystallinity of the ferroelectric film sample obtained by using the raw material solution 3. FIG. 14 is a diagram showing the crystallinity of the ferroelectric film sample obtained by using the raw material solution 4.

As shown in FIGS. 12 to 14, the (111) peak similar to that of PZT was observed for the samples obtained by using the raw material solutions 2 to 4 so that it was confirmed that a perovskite single-phase film was formed. Specifically, Bi and Nb were completely dissolved in PZT so that it was confirmed that Bi replaced the A site and Nb replaced the B site.

Figure 15:
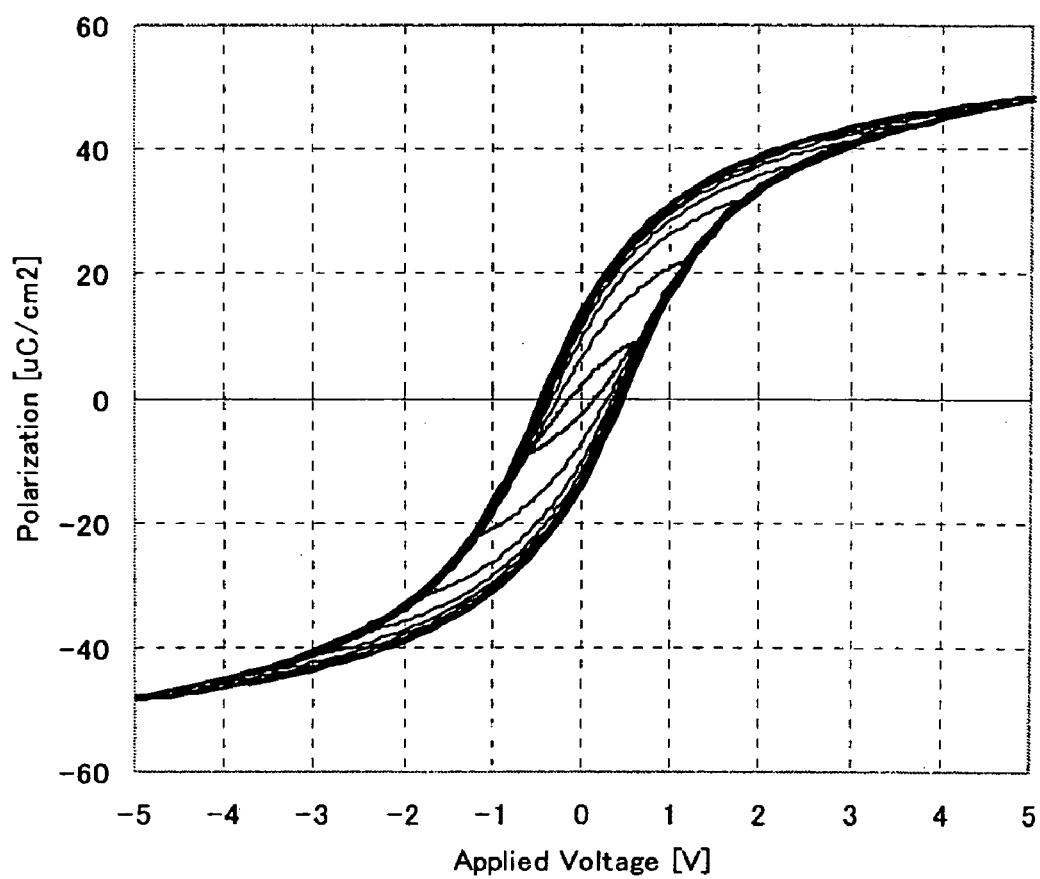
FIG. 15 shows hysteresis characteristics of a sample obtained by using a raw material solution 1.
Figure 16:
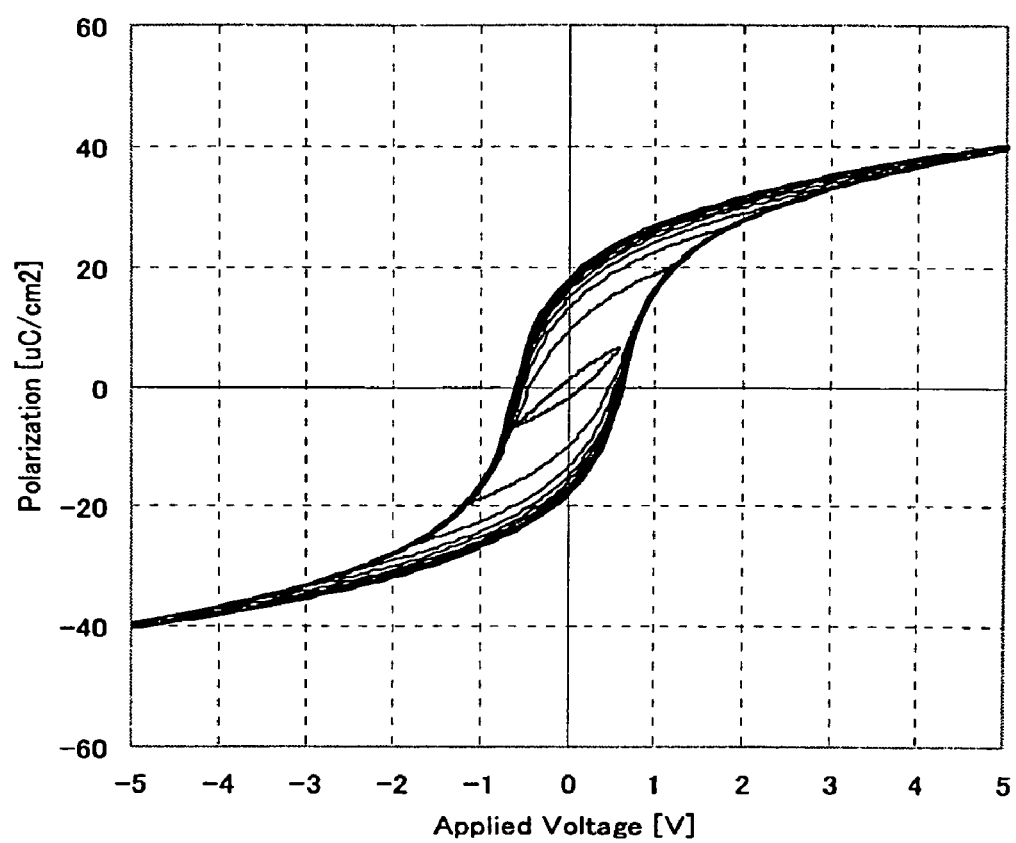
FIG. 16 shows hysteresis characteristics of a sample obtained by using a raw material solution 2.
Figure 17:
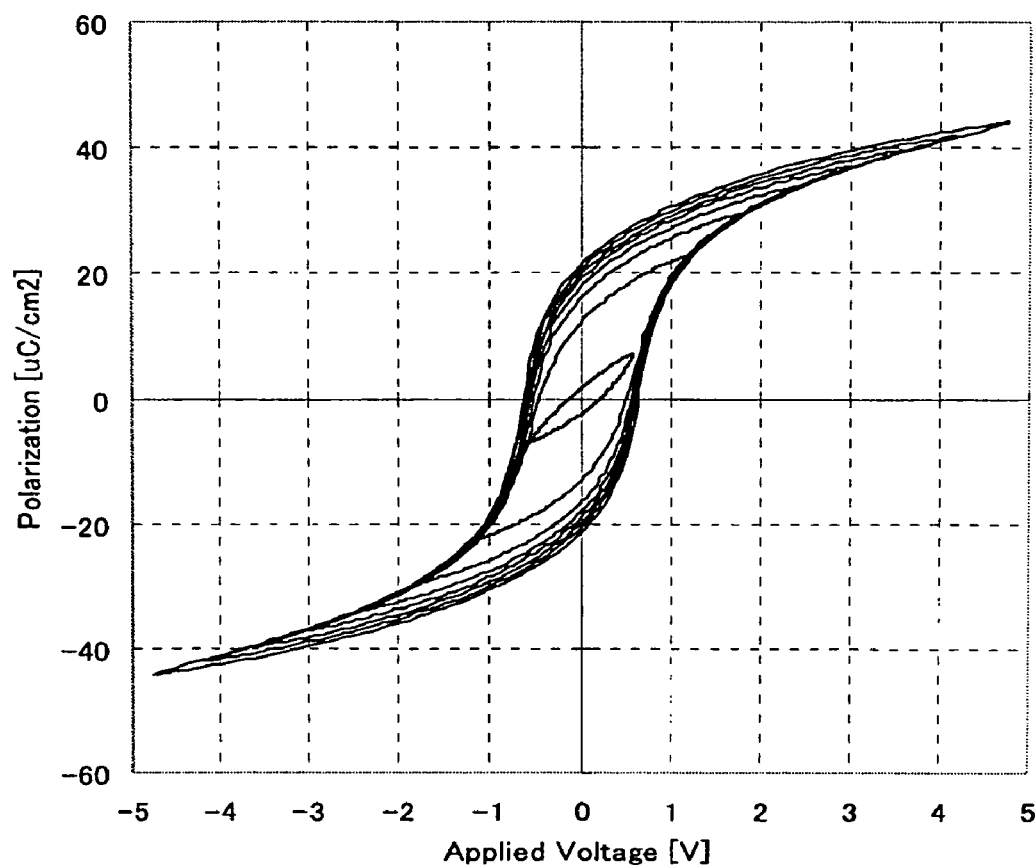
FIG. 17 shows hysteresis characteristics of a sample obtained by using a raw material solution 3.
Figure 18:
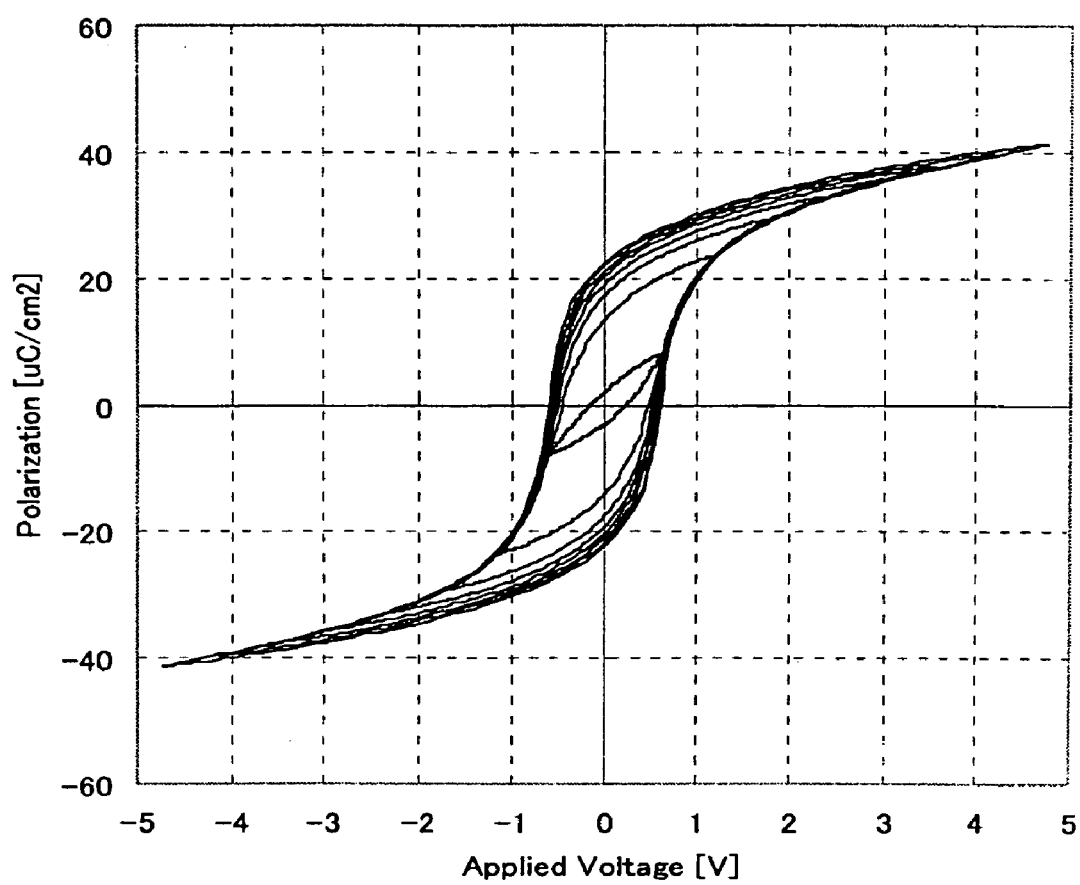
FIG. 18 shows hysteresis characteristics of a sample obtained by using a raw material solution 4.

FIGS. 15 to 18 show the hysteresis characteristics of the capacitor samples obtained by using the raw material solutions 1 to 4. FIG. 15 shows the hysteresis characteristics of the sample obtained by using the raw material solution 1. FIG. 16 shows the hysteresis characteristics of the sample obtained by using the raw material solution 2. FIG. 17 shows the hysteresis characteristics of the sample obtained by using the raw material solution 3. FIG. 18 shows the hysteresis characteristics of the sample obtained by using the raw material solution 4. As shown in FIGS. 15 to 18, it was confirmed that each capacitor sample has excellent hysteresis characteristics. In particular, the hysteresis squareness was improved as the amounts of Bi and Nb added were increased.

4.2 Experimental Example 2

Raw material solutions were prepared in the same manner as in Experimental Example 1 by mixing the solution 1 and the solution 2 at ratios given below.
Raw material solution 5: solution 1/solution 2=70/30
Raw material solution 6: solution 1/solution 2=40/60
Raw material solution 7: solution 1/solution 2=10/90
Capacitor samples were formed in the same manner as in Experimental Example 1, and the following characteristics were examined by using the resulting samples.

Figure 19:
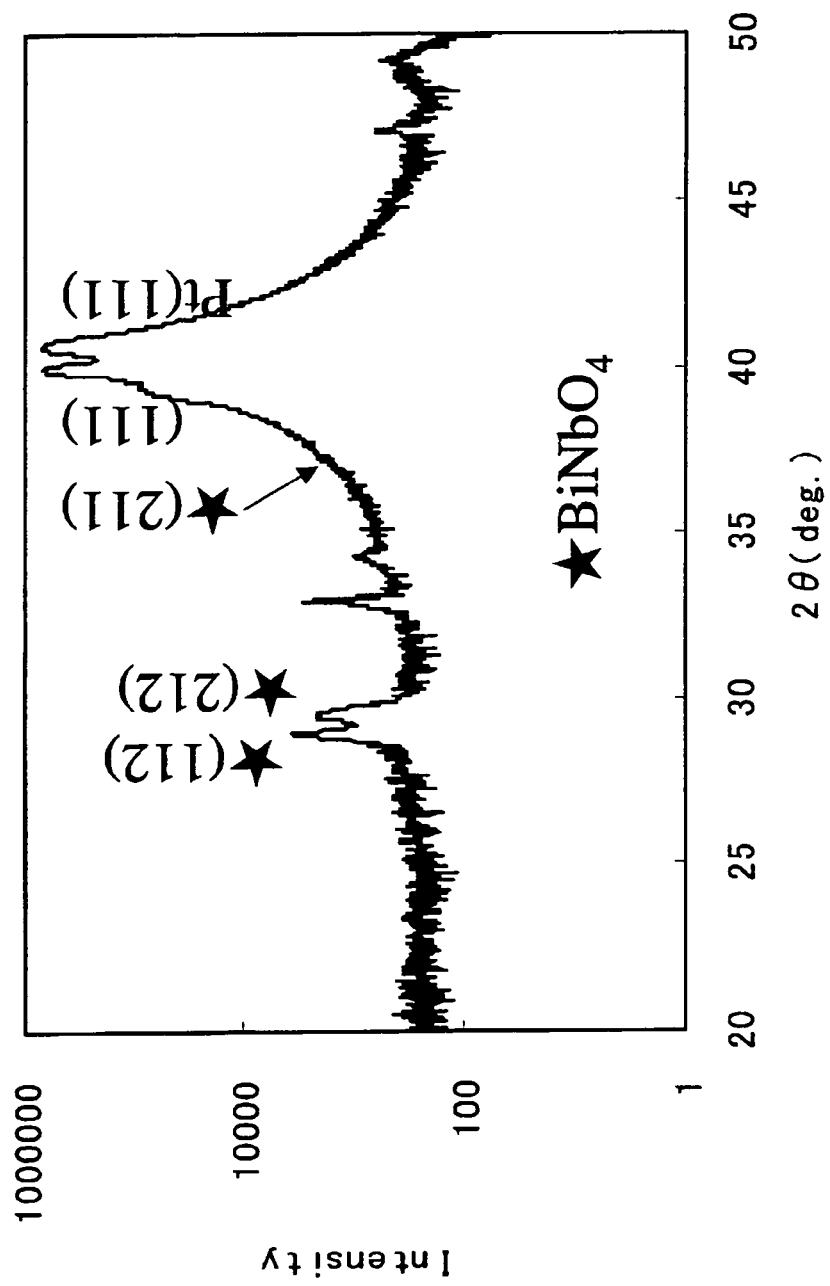
FIG. 19 shows crystallinity of ferroelectric film samples obtained by using raw material solutions 5 to 7.

The crystallinity of three ferroelectric film samples obtained by using the raw material solutions 5 to 7 was examined by X-ray diffraction analysis. The results shown in FIG. 19 were obtained for each ferroelectric film. As shown in FIG. 19, the (112), (212), and (211) peaks similar to those of BNO(BiNbO$_4$) and the (111) peak similar to that of PZT were observed so that it was confirmed that the resulting ferroelectric film includes a eutectic in which a bismuth-layered perovskite crystal of BNO and a perovskite crystal of PZT are mixed. In this case, Bi and Nb were also dissolved in PZT so that Bi replaced a part of the A site and Nb replaced a part of the B site.

Figure 20:
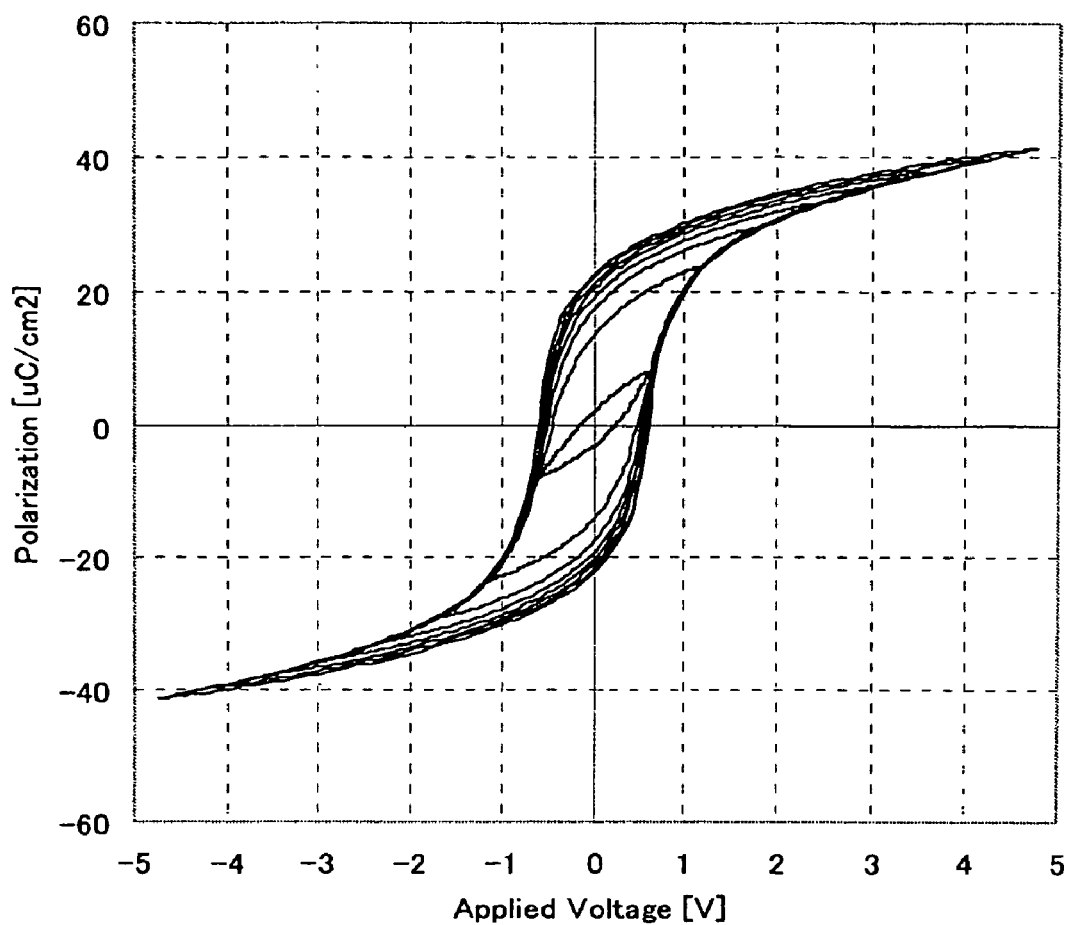
FIG. 20 shows hysteresis characteristics of a sample obtained by using a raw material solution 5.
Figure 21:
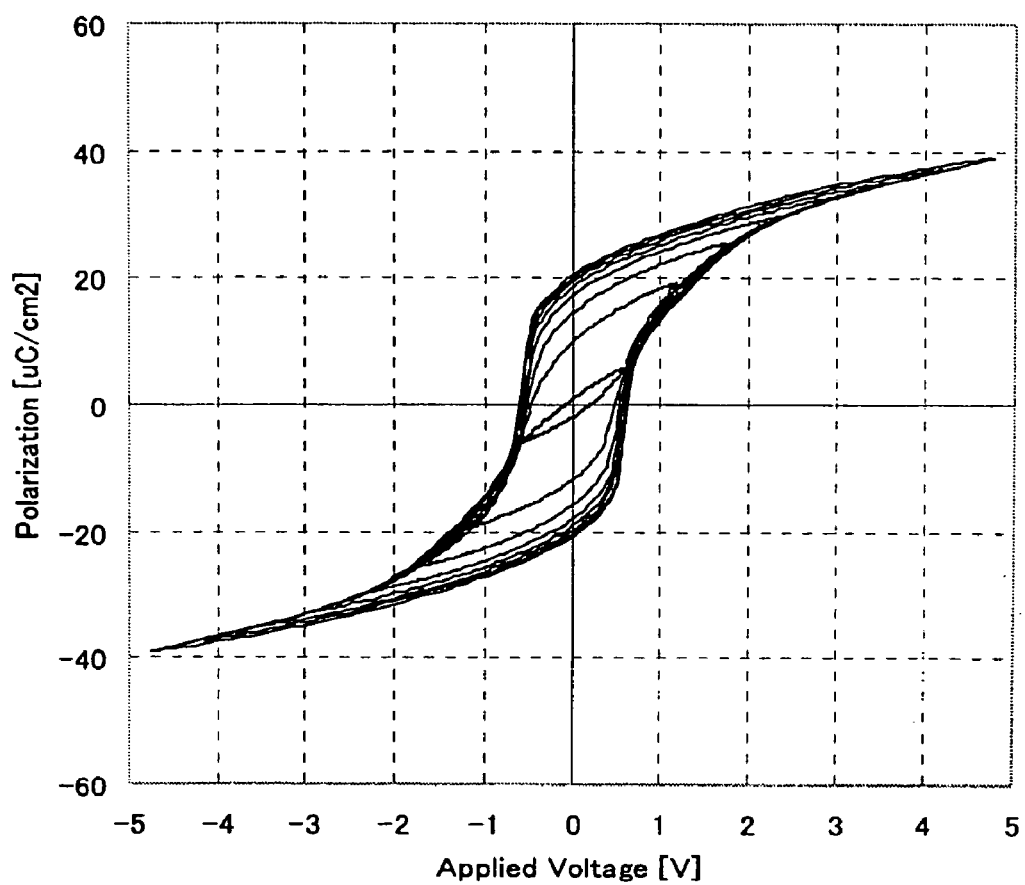
FIG. 21 shows hysteresis characteristics of a sample obtained by using a raw material solution 6.
Figure 22:
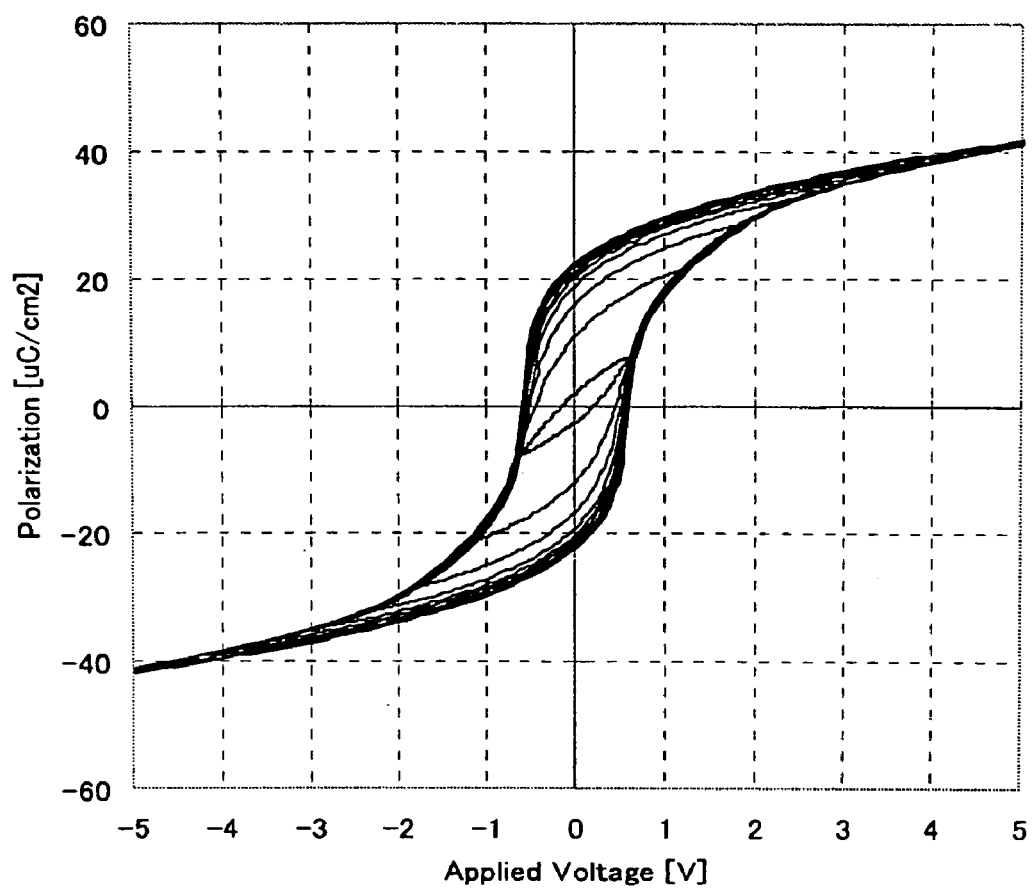
FIG. 22 shows hysteresis characteristics of a sample obtained by using a raw material solution 7.

FIGS. 20 to 22 show the hysteresis characteristics of the capacitor samples obtained by using the raw material solutions 5 to 7. FIG. 20 shows the hysteresis characteristics of the sample obtained by using the raw material solution 5. FIG. 21 shows the hysteresis characteristics of the sample obtained by using the raw material solution 6. FIG. 22 shows the hysteresis characteristics of the sample obtained by using the raw material solution 7. As shown in FIGS. 20 to 22, it was confirmed that each capacitor sample has excellent hysteresis characteristics.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A method of manufacturing a ferroelectric film including a ferroelectric shown by a general formula (Pb$_{1-d}$Bi$_d$)(B$_{1-a}$X$_a$)O$_3$,
B including at least one of Zr and Ti;
X including at least one of Nb and Ta;
"a" being in a range of "0.05≦a≦0.4";
"d" being in a range of "0<d<1"; and
the method comprising:
mixing a sol-gel raw material including a hydrolysis-condensation product of a metal alkoxide containing at least Zr and Ti, a polycarboxylic acid or a polycarboxylic acid ester, and an organic solvent; and
forming a ferroelectric precursor solution including an ester bond by esterification of the polycarboxylic acid or a polycarboxylic acid derived from the polycarboxylic acid ester and the metal alkoxide.

2. The method of manufacturing a ferroelectric film as defined in claim 1,
the ferroelectric film further including a crystal of BiNbO$_4$, and
the method comprising:
mixing a sol-gel raw material including a hydrolysis-condensation product of a metal alkoxide containing at least Zr and Ti, a polycarboxylic acid or a polycarboxylic acid ester, and an organic solvent; and
forming a ferroelectric precursor solution including an ester bond by esterification of the polycarboxylic acid or a polycarboxylic acid derived from the polycarboxylic acid ester and the metal alkoxide.

3. The method of manufacturing a ferroelectric film as defined in claim 1, comprising:
mixing a sol-gel raw material including a bismuth carboxylate when mixing the sol-gel raw material, the polycarboxylic acid or the polycarboxylic acid ester, and the organic solvent.

4. The method of manufacturing a ferroelectric film as defined in claim 1, comprising:
mixing a sol-gel raw material including a lead carboxylate when mixing the sol-gel raw material, the polycarboxylic acid or the polycarboxylic acid ester, and the organic solvent.

5. The method of manufacturing a ferroelectric film as defined in claim 1,
wherein the polycarboxylic acid or the polycarboxylic acid ester is a dicarboxylic acid or a dicarboxylic acid ester.

6. The method of manufacturing a ferroelectric film as defined in claim 1, comprising:
mixing a sol-gel raw material including Si or Si and Ge when mixing the sol-gel raw material, the polycarboxylic acid or the polycarboxylic acid ester, and the organic solvent.

7. A method of manufacturing a ferroelectric film including a ferroelectric shown by a general formula (Pb$_{1-d}$Bi$_d$)(B$_{1-a}$X$_a$)O$_3$,
B including at least one of Zr and Ti;
X including at least one of Nb and Ta;
"a" being in a range of "0.05≦a≦0.4";
"d" being in a range of "0<d<1"; and
the method comprising:
mixing a sol-gel raw material including a hydrolysis-condensation product of a metal alkoxide containing at least Zr and Ti, a polycarboxylic acid or a polycarboxylic acid ester, and an organic solvent;
forming a ferroelectric precursor solution including an ester bond by esterification of the polycarboxylic acid or a polycarboxylic acid derived from the polycarboxylic acid ester and the metal alkoxide; and
crystallizing the precursor solution.

* * * * *